(12) United States Patent
Ye

(10) Patent No.: US 10,930,619 B2
(45) Date of Patent: Feb. 23, 2021

(54) MULTI-WAFER BONDING STRUCTURE AND BONDING METHOD

(71) Applicant: WUHAN XINXIN SEMICONDUCTOR MANUFACTURING CO., LTD., Hubei (CN)

(72) Inventor: Guoliang Ye, Hubei (CN)

(73) Assignee: Wuhan XinXin Semiconductor Manufacturing Co., Ltd., Hubei (CN)

(*) Notice: Subject to any disclaimer, the term of this patent is extended or adjusted under 35 U.S.C. 154(b) by 0 days.

(21) Appl. No.: 16/249,118

(22) Filed: Jan. 16, 2019

(65) Prior Publication Data
US 2020/0075550 A1    Mar. 5, 2020

(30) Foreign Application Priority Data

Aug. 28, 2018  (CN) .......................... 201810988451.9

(51) Int. Cl.
*H01L 25/065*    (2006.01)
*H01L 21/027*    (2006.01)
(Continued)

(52) U.S. Cl.
CPC ...... *H01L 25/0657* (2013.01); *H01L 21/0274* (2013.01); *H01L 21/76898* (2013.01);
(Continued)

(58) Field of Classification Search
CPC ..... H01L 25/0657; H01L 25/50; H01L 24/80; H01L 21/76898; H01L 21/481; H01L 23/562; H01L 23/49827; H01L 21/187; H01L 2224/80894; H01L 2224/08146; H01L 2225/06524; H01L 2225/06541; H01L 23/481; H01L 2924/351; H01L 23/3192; H01L 23/3171; H01L 21/76802; H01L 21/76877; H01L 23/5226; H01L 23/5283; H01L 21/0274; H01L 24/08
See application file for complete search history.

(56) References Cited

U.S. PATENT DOCUMENTS

2016/0013160 A1* 1/2016 Chun ................. H01L 23/3192
                                                      257/751
2017/0141079 A1* 5/2017 Kao ....................... H01L 24/05

FOREIGN PATENT DOCUMENTS

CN    102054849 A    5/2011
CN    105280611 A    1/2016
(Continued)

*Primary Examiner* — Jasmine J Clark
(74) *Attorney, Agent, or Firm* — Muncy, Geissler, Olds & Lowe, P.C.

(57) ABSTRACT

A multi-wafer bonding structure and bonding method are disclosed. The multi-wafer bonding structure includes a first unit and a second unit, a metal layer of each wafer in the first unit electrically connected to an interconnection layer of the first unit, a first bonding layer in the first unit electrically connected to the interconnection layer of the first unit, a second bonding layer in the second unit electrically connected to a metal layer of the second unit, and the first bonding layer being in contact with the second bonding layer to achieve an electrical connection, thereby achieving the electrical connection among the interconnection layer of the first unit, the first bonding layer, the second bonding layer and the metal layer of each wafer.

20 Claims, 12 Drawing Sheets

(51) Int. Cl.
*H01L 21/768* (2006.01)
*H01L 23/48* (2006.01)
*H01L 23/00* (2006.01)
*H01L 25/00* (2006.01)

(52) U.S. Cl.
CPC .......... *H01L 23/481* (2013.01); *H01L 23/562* (2013.01); *H01L 24/08* (2013.01); *H01L 24/80* (2013.01); *H01L 25/50* (2013.01); H01L 2224/08146 (2013.01); H01L 2224/80894 (2013.01); H01L 2225/06524 (2013.01); H01L 2225/06541 (2013.01); H01L 2924/351 (2013.01)

(56) References Cited

FOREIGN PATENT DOCUMENTS

| | | |
|---|---|---|
| CN | 106653720 A | 5/2017 |
| CN | 106711055 A | 5/2017 |
| CN | 107994043 A | 5/2018 |
| TW | 201523855 A | 6/2015 |

* cited by examiner

MULTI-WAFER BONDING STRUCTURE AND BONDING METHOD

CROSS-REFERENCE TO RELATED APPLICATION

This application claims the priority of Chinese patent application number 201810988451.9, filed on Aug. 28, 2018, the entire contents of which are incorporated herein by reference.

TECHNICAL FIELD

The present invention relates to the technical field of integrated circuit manufacturing and, in particular, to a multi-wafer bonding structure and bonding method.

BACKGROUND

In the trend of developing highly integrated semiconductors, a 3D packaging technology is an effective way to improve the integration level and a signal interconnection speed. There are two common 3D packaging methods: 1. chip stacking based on lead wire bonding, which achieves interconnection by external lead wires; 2. package-on-package, which achieves interconnection by soldering solder balls of the devices. However, the lead wire bonding of the chip stacking and the solder ball soldering of the package-on-package have the defects of long interconnection distance, slow signal transmission, large signal delay and large power loss. Besides, the lead wires and the solder balls also occupy a large packaging space, which is not conducive to the increase of the integration density.

SUMMARY OF THE INVENTION

An object of the present invention is to reduce the interconnection distance between wafers, thereby increasing the transmission speed and reducing the power consumption.

Another object of the present invention is to reduce the multi-wafer packaging volume and improve the integration level of the wafer.

In order to solve the above technical problems, the present invention provides a multi-wafer bonding structure, comprising a first unit and a second unit. wherein:

the first unit comprises an upper wafer of the first unit and a lower wafer of the first unit that are bonded to each other; the second unit comprises at least one wafer; the upper wafer of the first unit and the second unit are bonded to each other; each wafer in the multi-wafer bonding structure comprises a substrate, a dielectric layer located on a surface of the substrate, and a metal layer embedded in the dielectric layer; the first unit further comprises a first unit TSV hole and an interconnection layer of the first unit filled in the first unit TSV hole; the interconnection layer of the first unit in the first unit TSV hole is respectively electrically connected to a metal layer of the upper wafer of the first unit and a metal layer of the lower wafer of the first unit; the upper wafer of the first unit further comprises a first passivation layer covering the interconnection layer of the first unit, a first lead-out hole penetrating through the first passivation layer and a first bonding layer filled in the first lead-out hole; the first bonding layer is in contact with the interconnection layer of the first unit so as to achieve an electrical connection; the wafer that is in the second unit and bonded to the upper wafer of the first unit further comprises a second passivation layer, a second lead-out hole penetrating through the second passivation layer and a second bonding layer filled in the second lead-out hole; the second bonding layer is electrically connected to a metal layer of the second unit; the first bonding layer is in contact with the second bonding layer so as to achieve an electrical connection; and the multi-wafer bonding structure further comprises a first trench and a lead-out layer; the first trench penetrates through the substrate and a portion of the dielectric layer of a topmost wafer in the multi-wafer bonding structure and is located above a metal layer of the topmost wafer; the metal layer of the topmost wafer is electrically connected to the second bonding layer; and the lead-out layer is formed at a bottom of the first trench and is electrically connected to the metal layer of the topmost wafer.

The present invention further provides a multi-wafer bonding method, comprising:

providing a first unit, wherein the first unit comprises an upper wafer of the first unit and a lower wafer of the first unit that are bonded to each other; each of the upper and lower wafers of the first unit comprises a substrate, a dielectric layer located on a surface of the substrate and a metal layer embedded in the dielectric layer; the first unit further comprises a first unit TSV hole and an interconnection layer of the first unit filled in the first unit TSV hole; the interconnection layer of the first unit in the first unit TSV hole is electrically connected to a metal layer of the upper wafer of the first unit and a metal layer of the lower wafer of the first unit; the upper wafer of the first unit further comprises a first passivation layer covering the interconnection layer of the first unit, a first lead-out hole penetrating through the first passivation layer and a first bonding layer filled in the first lead-out hole, the first bonding layer being in contact with the interconnection layer of the first unit so as to achieve an electrical connection;

providing a second unit, wherein the second unit comprises at least one wafer, each of the at least one wafer of the second unit comprising a substrate, a dielectric layer located on a surface of the substrate and a metal layer embedded in the dielectric layer; one of the at least one wafer in the second unit that is bonded to the upper wafer of the first unit further comprises a second passivation layer, a second lead-out hole penetrating through the second passivation layer and a second bonding layer filled in the second lead-out hole, the second bonding layer electrically connected to the metal layer of the second unit;

bonding the first unit and the second unit to form a multi-wafer bonding structure, wherein the upper wafer of the first unit and the second unit are bonded to each other, the first bonding layer being in contact with the second bonding layer so as to achieve an electrical connection; and forming a first trench and a lead-out layer, wherein the first trench penetrates through the substrate and a portion of the dielectric layer of a topmost wafer in the multi-wafer bonding structure and is located above a metal layer of the topmost wafer, the metal layer of the topmost wafer electrically connected to the second bonding layer, the lead-out layer being formed at a bottom of the first trench and electrically connected to the metal layer of the topmost wafer.

The present invention provides a multi-wafer bonding structure and bonding method. The multi-wafer bonding structure comprises a first unit and a second unit. The first unit comprises an upper wafer of the first unit and a lower wafer of the first unit that are bonded to each other. The second unit comprises at least one wafer. The upper wafer of the first unit and the second unit are bonded to each other.

A metal layer of each wafer in the first unit is electrically connected to an interconnection layer of the first unit. A first bonding layer in the first unit is electrically connected to the interconnection layer of the first unit. A second bonding layer in the second unit is electrically connected to a metal layer of the second unit. The first bonding layer is in contact with the second bonding layer so as to achieve an electrical connection, thereby achieving the electrical connection among the interconnection layer of the first unit, the first bonding layer, the second bonding layer and the metal layer of each wafer, which does not need an external lead wire structure, since the interconnection structure of the whole multi-wafer bonding structure is arranged inside the wafer. Compared to the prior art, the multi-wafer bonding structure of the present invention has the advantages of a short interconnection distance, a high signal transmission rate and a low power consumption, and is favorable for achieving a high-density multi-wafer integration and a multifunctional wafer integration.

In addition, the first trench and the lead-out layer are formed. The lead-out layer is formed at the bottom of the first trench and electrically connected to the metal layer of the topmost wafer. Compared to the conventional technique, the formation of the lead-out layer at the bottom of the first trench eliminates the process of firstly filling the whole trench with a metal layer (e.g., copper) and then processing the filling metal layer (e.g., copper) in the lead-out layer, thereby being favorable for reducing the cost.

LIST OF REFERENCE NUMERALS

Figure 1:
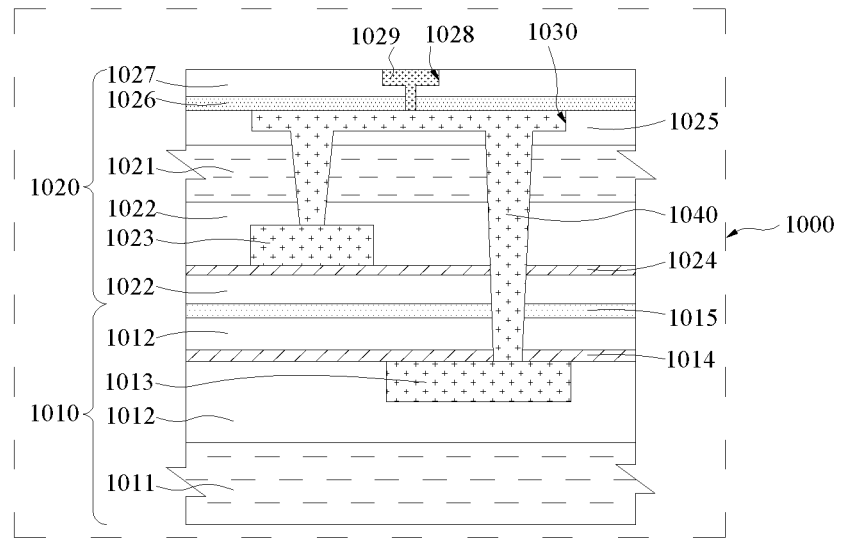
FIG. 1 is a cross-sectional schematic view of a first unit according to embodiment 1 of the present invention.

1000—first unit; 1030—first unit TSV hole; 1040—interconnection layer of the first unit; 1010—lower wafer of the first unit; 1011—substrate; 1012—dielectric layer; 1013—metal layer; 1014—etching stopping layer; 1015—passivation layer of the lower wafer of the first unit; 1016—first unit first connection hole; 1017—first unit first connection layer; 1016'—first unit second connection hole; 1017'—first unit second connection layer; 1018—etching stopping layer; 1019a—first unit lower passivation layer; 1019b—first unit lower lead—out hole; 1019c—first unit lower bonding layer; 1020—upper wafer of the first unit; 1021—substrate; 1022—dielectric layer; 1023—metal layer; 1024—etching stopping layer; 1025—insulation layer; 1026—isolation layer; 1027—first passivation layer; 1028—first lead—out hole; 1029—first bonding layer;

2027—second passivation layer; 2028—second lead—out hole; 2029—second bonding layer;

2100—second unit; 2111—substrate; 2112—dielectric layer; 2113—metal layer; 2114—etching stopping layer;

2200—second unit; 2230—second unit TSV hole; 2240—second unit interconnection layer; 2210—lower wafer of the second unit; 2211—substrate; 2212—dielectric layer; 2113—metal layer; 2214—etching stopping layer; 2215—passivation layer of the lower wafer of the second unit; 2216—second unit lower connection hole; 2217—second unit lower connection layer; 2218—etching stopping layer; 2220—upper wafer of the second unit; 2221—substrate; 2222—dielectric layer; 2223—metal layer; 2224—etching stopping layer; 2225—insulation layer; 2226—isolation layer; 2227—upper passivation layer of the second unit; 2228—upper lead—out hole of the second unit; 2229—upper bonding layer of the second unit;

2300—second unit; 2311—substrate; 2312—dielectric layer; 2313—metal layer; 2314—etching stopping layer; 2315—second unit connection hole; 2316—second unit connection layer; 2317—etching stopping layer; 2318—upper passivation layer of the second unit; 2319—second unit upper lead—out hole; 2320—upper bonding layer of the second unit; 2321—lower passivation layer of the second unit; 2322—second unit lower lead—out hole; 2323—lower bonding layer of the second unit;

3000—third unit; 3011—substrate; 3012—dielectric layer; 3013—metal layer; 3014—etching stopping layer; 3015—passivation layer of the third unit; 3016—lead—out hole of the third unit; 3017—bonding layer of the third unit;

4000—fourth unit; 4030—fourth unit TSV hole; 4040—interconnection layer of the fourth unit; 4010—lower wafer of the fourth unit; 4011—substrate; 4012—dielectric layer; 4013—metal layer; 4014—etching stopping layer; 4015—passivation layer of the lower wafer of the fourth unit; 4016—fourth unit lower connection hole; 4017—fourth unit lower connection layer; 4018—etching stopping layer; 4019a—lower passivation layer of the fourth unit; 4019b—lower lead—out hole of the fourth unit; 4019c—lower bonding layer of the fourth unit; 4020—upper wafer of the fourth unit; 4021—substrate; 4022—dielectric layer; 4023—metal layer; 4024—etching stopping layer; 4025—insulation layer; 4026—isolation layer; 4027—upper passivation layer of the fourth unit; 4028—upper lead—out hole of the fourth unit; 4029—upper bonding layer of the fourth unit;

5001—first trench; 5002—lead—out layer; 5003—first opening.

DETAILED DESCRIPTION

The multi-wafer bonding structure and bonding method provided by the present invention will be further described in detail below with reference to the accompanying drawings and specific embodiments. Advantages and features of the present invention will become more apparent from the description. It should be noted that the drawings are in a very simplified form and not necessarily drawn to scale, with the only intention to facilitate convenience and clarity in explaining the embodiments of the present invention.

An embodiment of the present invention provides a multi-wafer bonding structure, including a first unit and a second unit.

The first unit includes an upper wafer of the first unit, namely a first wafer of the first unit, and a lower wafer of the first unit, namely a second wafer of the first unit, that are bonded to each other. The second unit includes at least one wafer, and the upper wafers of the first unit and the second unit are bonded to each other. Each wafer in the multi-wafer bonding structure includes a substrate, a dielectric layer located on a surface of the substrate, and a metal layer embedded in the dielectric layer.

The first unit further includes a first unit TSV hole and an interconnection layer of the first unit filled in the first unit TSV hole. The interconnection layer of the first unit is electrically connected to a metal layer of the upper wafer of the first unit and a metal layer of the lower wafer of the first unit through the first unit TSV hole. The upper wafer of the first unit further includes a first passivation layer covering the interconnection layer of the first unit, a first lead-out hole penetrating through the first passivation layer and a first bonding layer filled in the first lead-out hole, and the first bonding layer is in contact with the interconnection layer of the first unit to achieve an electrical connection. The wafer in the second unit bonded to the upper wafer of the first unit further includes a second passivation layer, a second lead-out hole penetrating through the second passivation layer and a second bonding layer filled in the second lead-out hole, and the second bonding layer is electrically connected to the metal layer of the second unit. The first bonding layer is in contact with the second bonding layer to achieve an electrical connection.

The multi-wafer bonding structure further includes a first trench and a lead-out layer. The first trench penetrates through the substrate and a portion of the dielectric layer of the topmost wafer in the multi-wafer bonding structure and is located above the metal layer of the topmost wafer. The metal layer of the topmost wafer is electrically connected to the second bonding layer, and the lead-out layer is formed at the bottom of the first trench and electrically connected to the metal layer of the topmost wafer.

An embodiment of the present invention further provides a multi-wafer bonding method, including:

providing a first unit, wherein: the first unit includes an upper wafer of the first unit and a lower wafer of the first unit that are bonded to each other; each of the upper wafer of the first unit and the lower wafer of the first unit includes a substrate, a dielectric layer located on a surface of the substrate and a metal layer embedded in the dielectric layer; the first unit further includes a first unit TSV hole and an interconnection layer of the first unit filled in the first unit TSV hole; the interconnection layer of the first unit is electrically connected to metal layers of the upper wafer of the first unit and the lower wafer of the first unit through the first unit TSV hole; the upper wafer of the first unit further includes a first passivation layer covering the interconnection layer of the first unit, a first lead-out hole penetrating through the first passivation layer and a first bonding layer filled in the first lead-out hole; and the first bonding layer is in contact with the interconnection layer of the first unit to achieve electrical connection;

providing a second unit, wherein: the second unit includes at least one wafer; the wafer of the second unit includes a substrate, a dielectric layer located on a surface of the substrate and a metal layer embedded in the dielectric layer; the wafer in the second unit to be bonded to the upper wafer of the first unit further includes a second passivation layer, a second lead-out hole penetrating through the second passivation layer and a second bonding layer filled in the second lead-out hole; the second bonding layer is electrically connected to the metal layer of the second unit;

bonding the first unit and the second unit, wherein the upper wafer of the first unit and the second unit are bonded to each other, and the first bonding layer is in contact with the second bonding layer to achieve electrical connection; and forming a first trench and a lead-out layer, wherein the first trench penetrates through the substrate and a portion of the dielectric layer of the topmost wafer in the multi-wafer bonding structure and is located above the metal layer of the topmost wafer, the metal layer of the topmost wafer electrically connected to the second bonding layer, and the lead-out layer formed at the bottom of the first trench and electrically connected to the metal layer of the topmost wafer.

According to the multi-wafer bonding structure provided by the embodiment of the present invention, no external lead wire structure is needed, and the interconnection structure of the whole multi-wafer bonding structure is arranged within the wafer. Compared with the prior art, the multi-wafer bonding structure of the present invention has the advantages of a short interconnection distance, a high signal transmission speed and a low power consumption, and is favorable for achieving a high-density multi-wafer integration and a multifunctional wafer integration.

In addition, the first trench and the lead-out layer are formed. The lead-out layer is formed at the bottom of the first trench and electrically connected to the metal layer of the topmost wafer. Compared to the conventional technique, forming the lead-out layer at the bottom of the first trench eliminates the process of firstly filling the whole trench with a metal layer (e.g., copper) and then forming the filling metal layer (e.g., copper) in the lead-out layer, thereby being favorable for reducing the cost.

Embodiment 1

Figure 2:
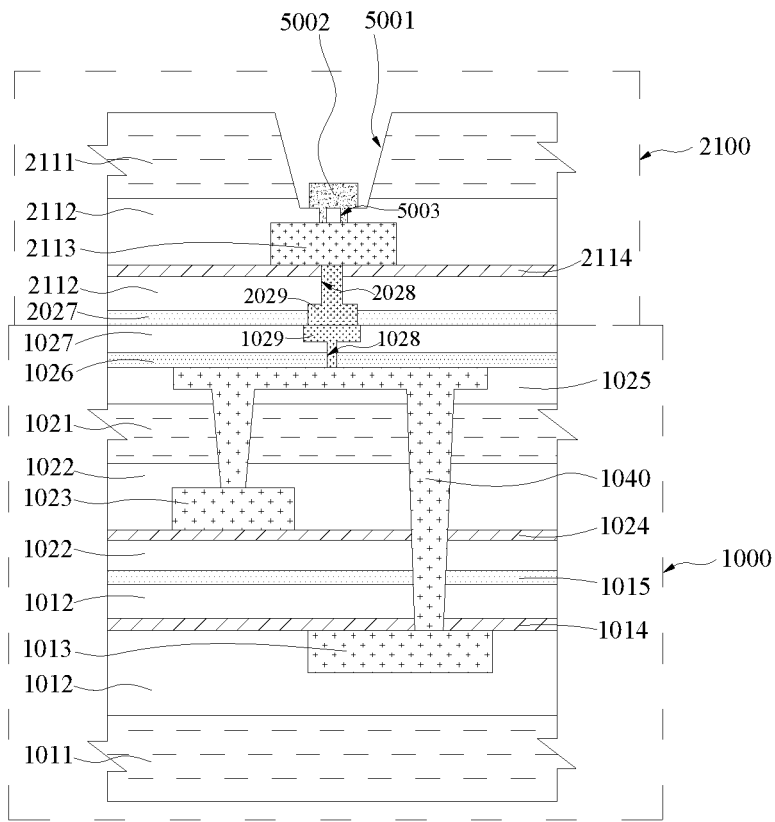
FIG. 2 is a cross-sectional schematic view of a multi-wafer bonding structure according to embodiment 1 of the present invention.

FIG. 1 is a cross-sectional schematic view of a first unit of this embodiment, and FIG. 2 is a cross-sectional schematic view of the multi-wafer bonding structure of this embodiment. As shown in FIG. 1 and FIG. 2, this embodiment provides a multi-wafer bonding structure, including a first unit 1000 and a second unit 2100 that are bonded to each other. The first unit 1000 includes an upper wafer of the first unit 1020 and a lower wafer of the first unit 1010 that are bonded together, and the second unit 2100 includes a second unit wafer. In this embodiment, the lower wafer of the first unit 1010, the upper wafer of the first unit 1020 and the second unit wafer are sequentially stacked from bottom to top, and the second unit wafer serves as the topmost wafer of the multi-wafer bonding structure.

Specifically, as shown in FIG. 1, the upper wafer of the first unit 1020 includes a substrate 1021, a dielectric layer 1022 located on a surface of the substrate 1021 and a metal layer 1023 embedded in the dielectric layer 1022. The lower wafer of the first unit 1010 includes a substrate 1011, a dielectric layer 1012 located on a surface of the substrate 1011 and a metal layer 1013 embedded in the dielectric layer 1012. The first unit 1000 further includes a first unit TSV hole 1030 and an interconnection layer of the first unit 1040 filled in the first unit TSV hole 1030. The interconnection layer of the first unit 1040 is respectively electrically connected to a metal layer 1023 of the upper wafer of the first unit 1020 and a metal layer 1013 of the lower wafer of the first unit 1010 through the first unit TSV hole 1030. The upper wafer of the first unit 1020 further includes a first passivation layer 1027 covering the interconnection layer of the first unit 1040, a first lead-out hole 1028 penetrating through the first passivation layer 1027 and a first bonding layer 1029 filled in the first lead-out hole 1028. The first bonding layer 1029 is in contact with the interconnection layer of the first unit 1040 to achieve an electrical connection.

The first passivation layer 1027 is, for example, a silicon nitride layer which is a hard film capable of a better protection for the surface of the wafer. An isolation layer 1026 is further deposited between the interconnection layer of the first unit 1040 and the first passivation layer 1027 and used for relieving the stress of the first passivation layer 1027. The isolation layer 1026 is, for example, a silicon oxide layer which has a good compactness and a good surface coverage and is used for improving the adhesion of the silicon nitride layer and relieving the stress of the silicon nitride layer, thereby preventing chip breakage on the wafer due to excessive stress on the silicon nitride layer.

Specifically, as shown in FIG. 2, the second unit 2100 includes a second unit wafer. The second unit wafer and the upper wafer of the first unit 1020 are bonded to each other. The second unit wafer includes a substrate 2111, a dielectric layer 2112 located on a surface of the substrate 2111 and a metal layer 2113 embedded in the dielectric layer 2112. The second unit wafers further includes a second passivation layer 2027 covering the dielectric layer 2112 thereof, a second lead-out hole 2028 penetrating through the second passivation layer 2027 and a portion of the dielectric layer 2112, and a second bonding layer 2029 filled in the second lead-out hole 2028. The second bonding layer 2029 is electrically connected to the metal layer 2113.

The first bonding layer 1029 is in contact with the second bonding layer 2029 to achieve an electrical connection.

With continued reference to FIG. 2, the multi-wafer bonding structure further includes a first trench 5001 and a lead-out layer 5002. The first trench 5001 penetrates through the substrate 2111 and a portion of the dielectric layer 2112 of the second unit wafer and is located above the metal layer 2113. The metal layer 2113 is electrically connected to the second bonding layer 2029, and the lead-out layer 5002 is formed at the bottom of the first trench 5001 and electrically connected to the metal layer 2113.

Further, the multi-wafer bonding structure of this embodiment further includes a first opening 5003. The first opening 5003 is located at the bottom of the first trench 5001 and interconnects with the first trench 5001. The first opening 5003 is located above the metal layer 2113 and exposes the metal layer 2113. The lead-out layer 5002 is electrically connected to the metal layer 2113 through the first opening 5003, and the material of the lead-out layer 5002 is, for example, aluminum.

This embodiment further provides a multi-wafer bonding method, including:

providing a first unit 1000, wherein: the first unit 1000 includes an upper wafer of the first unit 1020 and a lower wafer of the first unit 1010 that are bonded to each other; the first unit 1000 further includes a first unit TSV hole 1030 and an interconnection layer of the first unit 1040 filled in the first unit TSV hole 1030; the upper wafer of the first unit 1020 further includes a first passivation layer 1027 covering the interconnection layer of the first unit 1040, a first lead-out hole 1028 penetrating through the first passivation layer 1027 and a first bonding layer 1029 filled in the first lead-out hole 1028; the first bonding layer 1029 is in contact with the interconnection layer of the first unit 1040 to achieve electrical connection.

providing a second unit 2100, wherein: the second unit 2100 includes a second unit wafer; the second unit wafer includes a substrate 2111, a dielectric layer 2112 located on a surface of the substrate 2111 and a metal layer 2113 embedded in the dielectric layer 2112; the second unit wafer further includes a second passivation layer 2027 covering the dielectric layer 2112 thereof, a second lead-out hole 2028 penetrating through the second passivation layer 2027 and a portion of the dielectric layer 2112, and a second bonding layer 2029 filled in the second lead-out hole 2028; the second bonding layer 2029 is electrically connected to the metal layer 2113.

bonding the first unit 1000 and the second unit 2100, wherein the upper wafer of the first unit 1020 and the second unit wafer are bonded together, and the first bonding layer 1029 is in contact with the second bonding layer 2029 to achieve an electrical connection.

forming a first trench 5001 and a lead-out layer 5002, wherein: the first trench 5001 penetrates through the substrate 2111 and a portion of the dielectric layer 2112 of the second unit wafer and is located above the metal layer 2113; the metal layer 2113 is electrically connected to the second bonding layer 2029, and the lead-out layer 5002 is formed at the bottom of the first trench 5001 and electrically connected to the metal layer 2113.

Further, in the process of forming the first trench 5001 and the lead-out layer 5002, the method further includes forming a first opening 5003, wherein the first opening 5003 is located at the bottom of the first trench 5001 and interconnects with the first trench 5001; the first opening 5003 is located above the metal layer 2113 and exposes the metal layer 2113; the lead-out layer 5002 is electrically connected to the metal layer 2113 through the first opening 5003, and the material of the lead-out layer 5002 is, for example, aluminum.

Further, the process for forming the lead-out layer 5002 includes:

depositing a lead-out layer, wherein the lead-out layer is filled in the first opening 5003 and covers a surface of the first trench 5001 and a surface of the topmost wafer;

forming a photoresist, wherein the photoresist is filled in the first trench 5001 and covers a surface of the lead-out layer;

forming a patterned photoresist by exposing and developing, wherein the patterned photoresist covers the bottom of the first trench;

removing the uncovered lead-out layer by dry etching with the patterned photoresist serving as a mask; and removing the patterned photoresist.

In this embodiment, the 3 wafers (the lower wafer of the first unit 1010, the upper wafer of the first unit 1020 and the second unit wafer) are bonded together. The first unit 1000 (the two wafers include a TSV structure) (end to end) and the second unit 2100 achieve an electrical connection through contacting the first bonding layer 1029 (lead-out terminal of the interconnection layer of the first unit 1040) to the second bonding layer 2029 (lead-out terminal of the metal layer 2113 of the second unit wafer).

Embodiment 2

Figure 3:
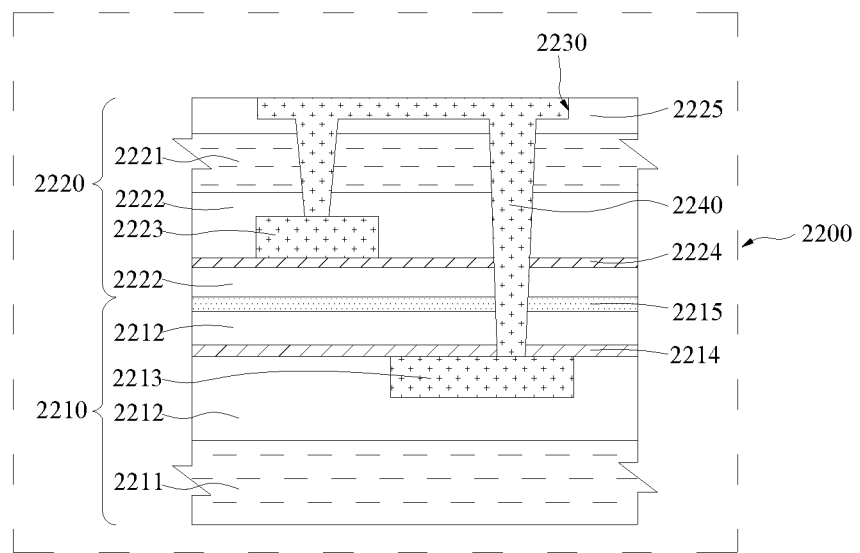
FIG. 3 is a cross-sectional schematic view of a second unit according to embodiment 2 of the present invention.
Figure 4:
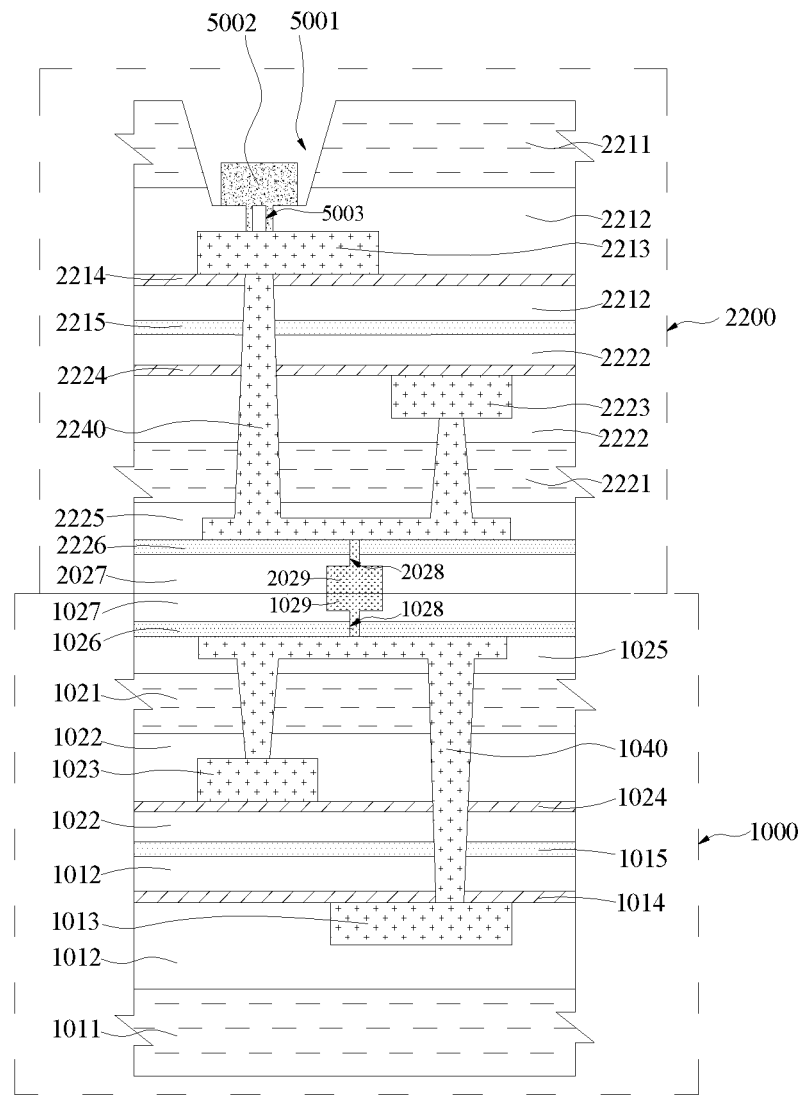
FIG. 4 is a cross-sectional schematic view of a multi-wafer bonding structure according to embodiment 2 of the present invention.

FIG. 3 is a cross-sectional schematic view of a second unit of this embodiment, and FIG. 4 is a cross-sectional schematic view of the multi-wafer bonding structure of this embodiment. As shown in FIG. 3 and FIG. 4, a multi-wafer bonding structure includes a first unit 1000 and a second unit 2200 that are bonded to each other. The first unit 1000 includes an upper wafer of the first unit 1020 and a lower wafer of the first unit 1010 that are bonded to each other. The second unit 2200 includes an upper wafer of the second unit 2220, namely a third wafer of the second unit, and a lower wafer of the second unit 2210, namely a fourth wafer of the second unit, that are bonded to each other. The upper wafer of the second unit 2220 and the upper wafer of the first unit 1020 are bonded to each other. In this embodiment, the lower wafer of the first unit 1010, the upper wafer of the first unit 1020, the upper wafer of the second unit 2220 and the lower wafer of the second unit 2210 are sequentially stacked from bottom to top. The lower wafer of the second unit 2210 serves as the topmost wafer of the multi-wafer bonding structure.

The structure of the first unit 1000 of this embodiment is the same as that of embodiment 1, and is not described in detail herein.

Specifically, as shown in FIG. 3, the second unit 2200 includes the upper wafer of the second unit 2220 and the lower wafer of the second unit 2210 that are bonded to each other. The upper wafer of the second unit 2220 includes a substrate 2221, a dielectric layer 2222 located on a surface of the substrate 2221 and a metal layer 2223 embedded in the dielectric layer 2222. The lower wafer of the second unit 2210 includes a substrate 2211, a dielectric layer 2212 located on a surface of the substrate 2211 and a metal layer 2213 embedded in the dielectric layer 2212. The second unit 2200 further includes a second unit TSV hole 2230 and a second unit interconnection layer 2240 filled in the second unit TSV hole 2230. The second unit interconnection layer 2240 is respectively electrically connected to the metal layer 2223 of the upper wafer of the second unit 2220 and the metal layer 2213 of the lower wafer of the second unit 2210 through the second unit TSV hole 2230.

With continued reference to FIG. 4, the second passivation layer 2027 is located in the upper wafer of the second unit 2220 and covers the second unit interconnection layer 2240. The second lead-out hole 2028 penetrates through the second passivation layer 2027. The second bonding layer 2029 is filled in the second lead-out hole 2028 and electrically connected to the second unit interconnection layer 2040. The first bonding layer 1029 is in contact with the second bonding layer 2029 to achieve an electrical connection.

The second passivation layer 2027 is, for example, a silicon nitride layer which is a hard film capable of a better protection for the surface of the wafer. Further, an isolation layer 2226 is deposited between the second unit interconnection layer 2040 and the second passivation layer 2027.

The isolation layer 2226 is, for example, a silicon oxide layer which has a good compactness and a good surface coverage and is used for improving the adhesion of the silicon nitride layer and relieving the stress of the silicon nitride layer, thereby preventing chip breakage on the wafer due to excessive stress on the silicon nitride layer.

This embodiment further provides a multi-wafer bonding method, including:

providing a first unit 1000, wherein the first unit 1000 includes an upper wafer of the first unit 1020 and a lower wafer of the first unit 1010 that are bonded to each other; the first unit 1000 further includes a first bonding layer 1029;

providing a second unit 2200, wherein the second unit 2200 includes an upper wafer of the second unit 2220 and a lower wafer of the second unit 2210 that are bonded to each other; the second unit 2200 further includes a second bonding layer 2029;

bonding the first unit 1000 and the second unit 2200, wherein the upper wafer of the second unit 2220 and the upper wafer of the first unit 1020 are bonded to each other; and the first bonding layer 1029 is in contact with the second bonding layer 2029 to achieve an electrical connection; and forming a first trench 5001 and a lead-out layer 5002, wherein the first trench 5001 penetrates through the substrate 2211 and a portion of the dielectric layer 2212 of the lower wafer of the second unit 2210 and is located above the metal layer 2213; the metal layer 2213 is electrically connected to the second bonding layer 2029; and the lead-out layer 5002 is formed at the bottom of the first trench 5001 and electrically connected to the metal layer 2213.

In this embodiment, the 4 wafers (the lower wafer of the first unit 1010, the upper wafer of the first unit 1020, the upper wafer of the second unit 2220 and the lower wafer of the second unit 2210) are bonded together. The first unit 1000 (the two wafers include a TSV structure) and the second unit 2200 (the two wafers include a TSV structure) achieve an electrical connection through contacting (terminal to terminal) the first bonding layer 1029 (lead-out terminal of the interconnection layer of the first unit 1040) and the second bonding layer 2029 (lead-out terminal of the second unit interconnection layer 2040).

Embodiment 3

Figure 5:
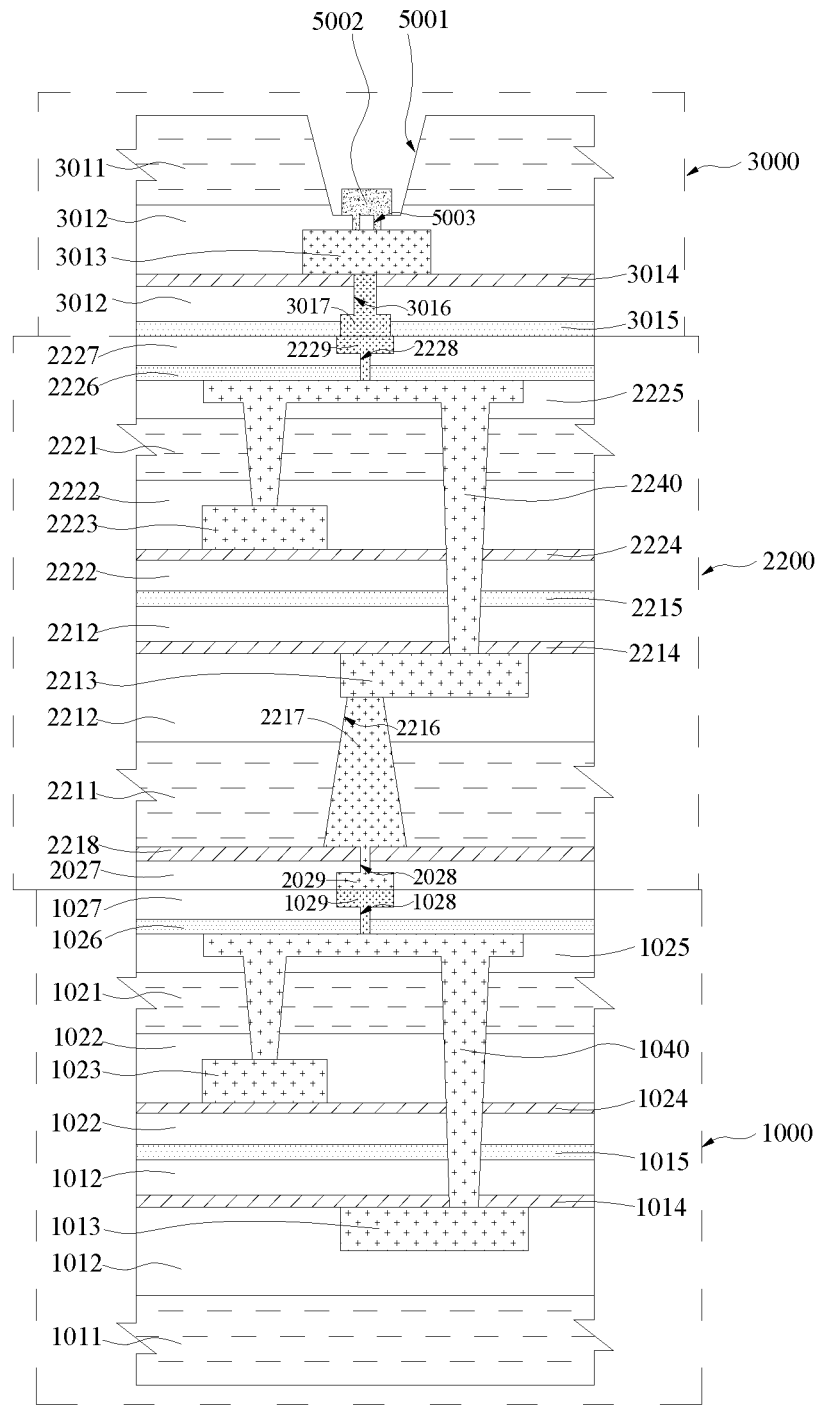
FIG. 5 is a cross-sectional schematic view of a multi-wafer bonding structure according to embodiment 3 of the present invention.

FIG. 5 is a cross-sectional schematic view of a multi-wafer bonding structure of this embodiment. As shown in FIG. 3 and FIG. 5, a multi-wafer bonding structure of this embodiment includes a first unit 1000, a second unit 2200 and a third unit 3000 that are bonded sequentially. The first unit 1000 includes an upper wafer of the first unit 1020 and a lower wafer of the first unit 1010 that are bonded together. The second unit 2200 includes an upper wafer of the second unit 2220 and a lower wafer of the second unit 2210 that are bonded to each other. The third unit 3000 includes a third unit wafer. The upper wafer of the second unit 2220 is bonded to the third unit wafer, and the lower wafer of the second unit 2210 and the upper wafer of the first unit 1020 are bonded to each other. In this embodiment, the lower wafer of the first unit 1010, the upper wafer of the first unit 1020, the lower wafer of the second unit 2210, the upper wafer of the second unit 2220 and the third unit wafer are sequentially stacked from bottom to top. The third unit wafer serves as the topmost wafer of the multi-wafer bonding structure.

The structure of the first unit 1000 of this embodiment is the same as that of embodiment 1, and is not described in detail herein.

The structure of the second unit 2200 of this embodiment is similar to that of the second unit in embodiment 2 shown in FIG. 3, and the difference is: the lower wafer of the second unit 2210 further includes a second unit lower connection hole 2216, namely a second unit connection hole, penetrating through a substrate 2211 thereof and exposing a metal layer 2213 thereof, and a second unit lower connection layer 2217, namely a second unit connection layer, filled in the second unit lower connection hole 2216; the second passivation layer 2027 is located in the lower wafer of the second unit 2210 and covers the second unit lower connection layer 2217. Preferably, an etching stopping layer 2218 is deposited between the second passivation layer 2027 and the second unit lower connection layer 2217. A second lead-out hole 2028 penetrates through the second passivation layer 2027 and interconnects with the second unit lower connection hole 2216. A second bonding layer 2029 is filled in the second lead-out hole 2028 and electrically connected to the metal layer 2213 of the lower wafer of the second unit 2210 through the second unit lower connection layer 2217. The upper wafer of the second unit 2220 further includes an upper passivation layer of the second unit 2227, namely an additional second passivation layer, covering the second unit interconnection layer 2240, a second unit upper lead-out hole 2228, namely an additional second lead-out hole, penetrating through the upper passivation layer of the second unit 2227, and an upper bonding layer of the second unit 2229, namely an additional second bonding layer, arranged in the second unit upper lead-out hole 2228. The upper bonding layer of the second unit 2229 is electrically connected to the second unit interconnection layer 2240.

The third unit wafer of this embodiment includes a substrate 3011, a dielectric layer 3012 located on a surface of the substrate 3011, a metal layer 3013 embedded in the dielectric layer 3012, a passivation layer of the third unit 3015 covering the dielectric layer 3012, a third unit lead-out hole 3016 penetrating through the passivation layer of the third unit 3015 and a portion of the dielectric layer 3012, as well as a bonding layer of the third unit 3017 arranged in the third unit lead-out hole 3016.

The bonding layer of the third unit 3017 is electrically connected to the metal layer 3013. The bonding layer of the third unit 3017 is in contact with the upper bonding layer of the second unit 2229 to achieve an electrical connection. The first bonding layer 1029 is in contact with the second bonding layer 2029 to achieve an electrical connection.

Preferably, an etching stopping layer 3014 covering the metal layer 3013 is embedded and arranged in the dielectric layer 3012 of the third unit wafer, and serves as an etching stopping layer for forming the third unit lead-out hole 3016.

This embodiment further provides a multi-wafer bonding method, including:

providing a first unit 1000, wherein the first unit 1000 includes an upper wafer of the first unit 1020 and a lower wafer of the first unit 1010 bonded to each other; and the first unit 1000 further includes a first bonding layer 1029;

providing a second unit 2200, wherein the second unit 2200 includes an upper wafer of the second unit 2220 and a lower wafer of the second unit 2210 bonded to each other;

forming a second unit lower connection hole 2216, wherein the second unit lower connection hole 2216 penetrates through the substrate 2211 of the lower wafer of the second unit and exposes the metal layer 2213 of the lower wafer of the second unit;

forming a second unit lower connection layer 2217, wherein the second unit lower connection layer 2217 is filled in the second unit lower connection hole 2216;

forming a second passivation layer 2027, wherein the second passivation layer 2027 is located in the lower wafer of the second unit 2210 and covers the second unit lower connection layer 2217;

forming a second lead-out hole 2028, wherein the second lead-out hole 2028 penetrates through the second passivation layer 2027 and interconnects with the second unit lower connection hole 2216;

forming a second bonding layer 2029, wherein the second bonding layer 2029 is filled in the second lead-out hole 2028 and electrically connected to the metal layer 2213 through the second unit lower connection layer 2217;

forming an upper passivation layer of the second unit 2227, wherein the upper passivation layer of the second unit 2227 is located in the upper wafer of the second unit 2220 and covers the second unit interconnection layer 2240;

forming a second unit upper lead-out hole 2228, wherein the second unit upper lead-out hole 2228 penetrates through the upper passivation layer of the second unit 2227;

forming an upper bonding layer of the second unit 2229, wherein the upper bonding layer of the second unit 2229 is filled in the second unit upper lead-out hole 2228 and electrically connected to the second unit interconnection layer 2240;

providing a third unit 3000, wherein the third unit 3000 includes a third unit wafer, and the third unit wafer further includes a bonding layer of the third unit 3017;

bonding the lower wafer of the second unit 2210 to the upper wafer of the first unit 1020, and bonding the upper wafer of the second unit 2220 to the third unit wafer, wherein the bonding layer of the third unit 3017 is in contact with the upper bonding layer of the second unit 2229 to achieve an electrical connection; and the first bonding layer 1029 is in contact with the second bonding layer 2029 to achieve an electrical connection; and forming a first trench 5001 and a lead-out layer 5002, wherein the first trench 5001 penetrates through the substrate 3011 and a portion of the dielectric layer 3012 of the third unit wafer and is located above the metal layer 3013; the lead-out layer 5002 is formed at the bottom of the first trench 5001 and electrically connected to the metal layer 3013.

In this embodiment, the 5 wafers (the lower wafer of the first unit 1010, the upper wafer of the first unit 1020, the lower wafer of the second unit 2210, the upper wafer of the second unit 2220, and the third unit wafer) are bonded together. The first unit 1000 (the two wafers include a TSV structure) and the second unit 2200 (the two wafers include a TSV structure) achieve an electrical connection through contacting (terminal to terminal) the first bonding layer 1029 (lead-out terminal of the interconnection layer of the first unit 1040) and the second bonding layer 2029 (lead-out terminal of the metal layer 2213 of the lower wafer of the second unit). The third unit 3000 and the second unit 2200 (the two wafers include a TSV structure) achieve an electrical connection through contacting (terminal to terminal) the bonding layer of the third unit 3017 (lead-out terminal of the metal layer 3013 of the third unit) and the upper bonding layer of the second unit 2229 (lead-out terminal of the second unit interconnection layer 2240).

Embodiment 4

Figure 6:
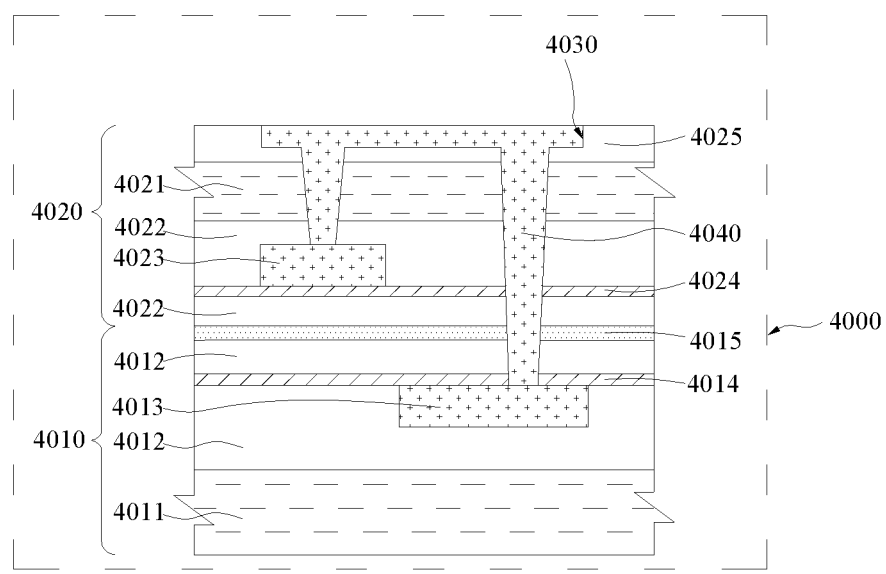
FIG. 6 is a cross-sectional schematic view of a fourth unit according to embodiment 4 of the present invention.
Figure 7:
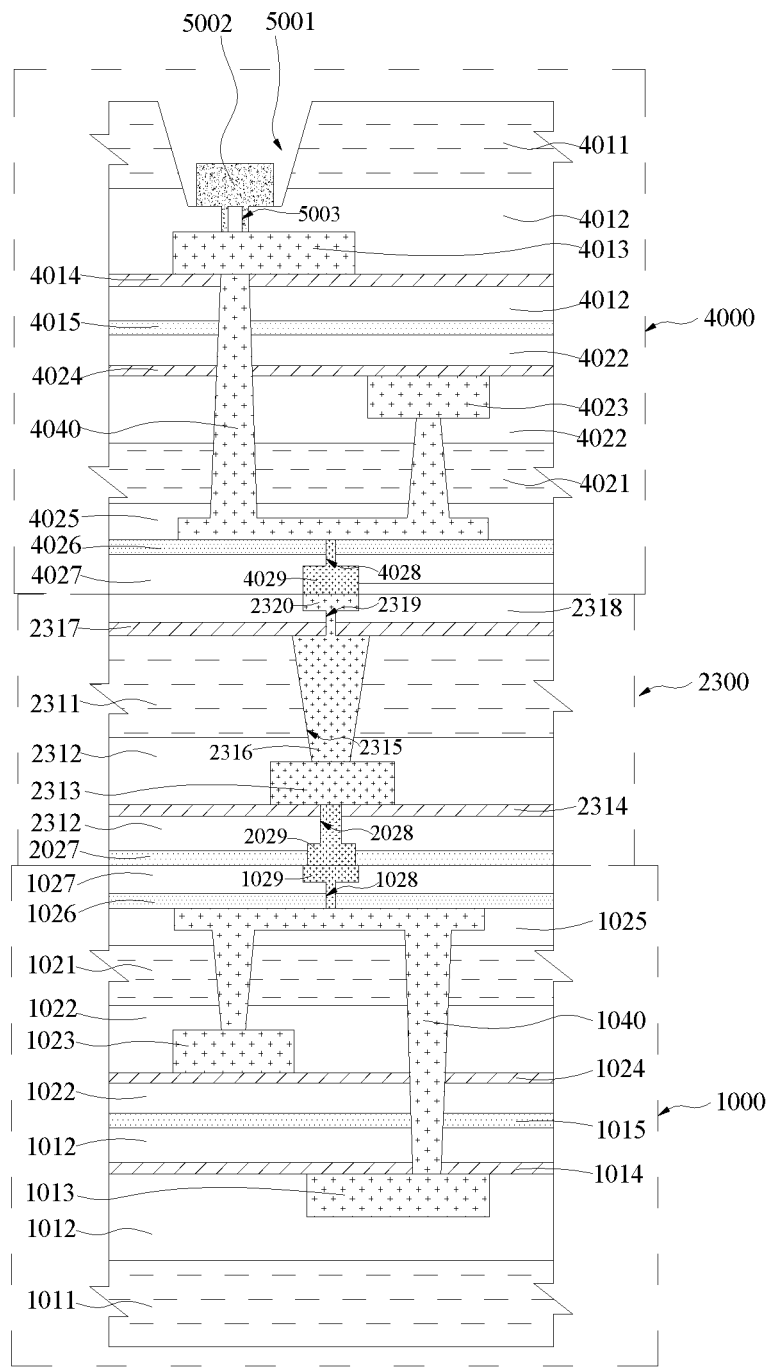
FIG. 7 is a cross-sectional schematic view of a multi-wafer bonding structure according to embodiment 4 of the present invention.

FIG. 6 is a cross-sectional schematic view of a fourth unit of this embodiment, and FIG. 7 is a cross-sectional schematic view of the multi-wafer bonding structure of this embodiment. As shown in FIG. 6 and FIG. 7, a multi-wafer bonding structure includes a first unit 1000, a second unit 2300 and a fourth unit 4000 that are bonded sequentially.

The first unit 1000 includes an upper wafer of the first unit 1020 and a lower wafer of the first unit 1010 that are bonded to each other. The second unit 2300 includes a second unit wafer. The fourth unit 4000 includes an upper wafer of the fourth unit 4020, namely a fifth wafer of the fourth unit, and a lower wafer of the fourth unit 4010, namely a sixth wafer of the fourth unit, that are bonded to each other. In this embodiment, the lower wafer of the first unit 1010, the upper wafer of the first unit 1020, the second unit wafer, the upper wafer of the fourth unit 4020 and the lower wafer of the fourth unit 4010 are sequentially stacked from bottom to top, and the lower wafer of the fourth unit 4010 serves as the topmost wafer of the multi-wafer bonding structure.

The structure of the first unit 1000 of this embodiment is the same as that of embodiment 1, and is not described in detail herein.

Specifically, as shown in FIG. 6, the fourth unit 4000 includes an upper wafer of the fourth unit 4020 and a lower wafer of the fourth unit 4010 that are bonded to each other. The upper wafer of the fourth unit 4020 includes a substrate 4021, a dielectric layer 4022 located on a surface of the substrate 4021 and a metal layer 4023 embedded in the dielectric layer 4022. The lower wafer of the fourth unit 4010 includes a substrate 4011, a dielectric layer 4012 located on a surface of the substrate 4011 and a metal layer 4013 embedded in the dielectric layer 4012. The fourth unit 4000 further includes a fourth unit TSV hole 4030 and an interconnection layer of the fourth unit 4040, namely a fourth unit interconnection layer, filled in the fourth unit TSV hole 4030. The interconnection layer of the fourth unit 4040 is electrically connected to a metal layer 4023 of the upper wafer of the fourth unit 4020 and a metal layer 4013 of the lower wafer of the fourth unit 4010 through the fourth unit TSV hole 4030.

With continued reference to FIG. 7, the second unit 2300 includes a second unit wafer. The second unit wafer includes a substrate 2311, a dielectric layer 2312 located on a surface of the substrate 2311, a metal layer 2313 embedded in the dielectric layer 2312, a second unit connection hole 2315 penetrating through the substrate 2311 and exposing the metal layer 2313, a second unit connection layer 2316 filled in the second unit connection hole 2315, an upper passivation layer of the second unit 2318 covering the second unit connection layer 2316, a second unit upper lead-out hole 2319 penetrating through the upper passivation layer of the second unit 2318, and an upper bonding layer of the second unit 2320 filled in the second unit upper lead-out hole 2319. The upper bonding layer of the second unit 2320 is electrically connected to the metal layer 2313 of the second unit wafer through the second unit connection layer 2316. The second passivation layer 2027 is located in the second unit wafer and covers the dielectric layer 2312 of second unit wafer. The second lead-out hole 2028 penetrates through the second passivation layer 2027 and a portion of the dielectric layer 2312. The second bonding layer 2029 is filled in the second lead-out hole 2028 and electrically connected to the metal layer 2313.

Preferably, an etching stopping layer 2317 is deposited between the second unit connection layer 2316 and the upper passivation layer of the second unit 2318 and serves as an etching stopping layer for forming the second unit upper lead-out hole 2319.

Preferably, an etching stopping layer 2314 covering the metal layer 2313 is deposited in the dielectric layer 2312.

The upper wafer of the fourth unit 4020 further includes an upper passivation layer of the fourth unit 4027, namely an additional fourth passivation layer, covering the interconnection layer of the fourth unit 4040, a fourth unit upper lead-out hole 4028 penetrating through the upper passivation layer of the fourth unit 4027 and an upper bonding layer of the fourth unit 4029, namely an additional fourth passivation layer, filled in the fourth unit upper lead-out hole 4028. The upper bonding layer of the fourth unit 4029 is electrically connected to the interconnection layer of the fourth unit 4040.

Further, the upper passivation layer of the fourth unit 4027 is, for example, a silicon nitride layer which is a hard film capable of a better protection for the surface of the wafer.

Further, an isolation layer 4026 is filled between the interconnection layer of the fourth unit 4040 and the upper passivation layer of the fourth unit 4027. The isolation layer 4026 is, for example, a silicon oxide layer used for relieving the stress of the upper passivation layer (silicon nitride layer) of the fourth unit 4027.

The upper bonding layer of the fourth unit 4029 is in contact with the upper bonding layer of the second unit 2320 to achieve an electrical connection. The first bonding layer 1029 is in contact with the second bonding layer 2029 to achieve an electrical connection.

In this embodiment, the 5 wafers (the lower wafer of the first unit 1010, the upper wafer of the first unit 1020, the second unit wafer, the upper wafer of the fourth unit 4020 and the lower wafer of the fourth unit 4010) are bonded together. The first unit 1000 (the two wafers include a TSV structure) and the second unit 2300 achieve an electrical connection through contacting (terminal to terminal) the first bonding layer 1029 (lead-out terminal of the interconnection layer of the first unit 1040) and the second bonding layer 2029 (lower lead-out terminal of the metal layer 2313 of the second unit wafer). The fourth unit 4000 (the two wafers include a TSV structure) and the second unit 2300 achieve an electrical connection through contacting (terminal to terminal) the upper bonding layer of the fourth unit 4029 (lead-out terminal of interconnection layer of the fourth unit 4040) and the upper bonding layer of the second unit 2320 (upper lead-out terminal of the metal layer 2313 of the second unit wafer).

Embodiment 5

Figure 8:
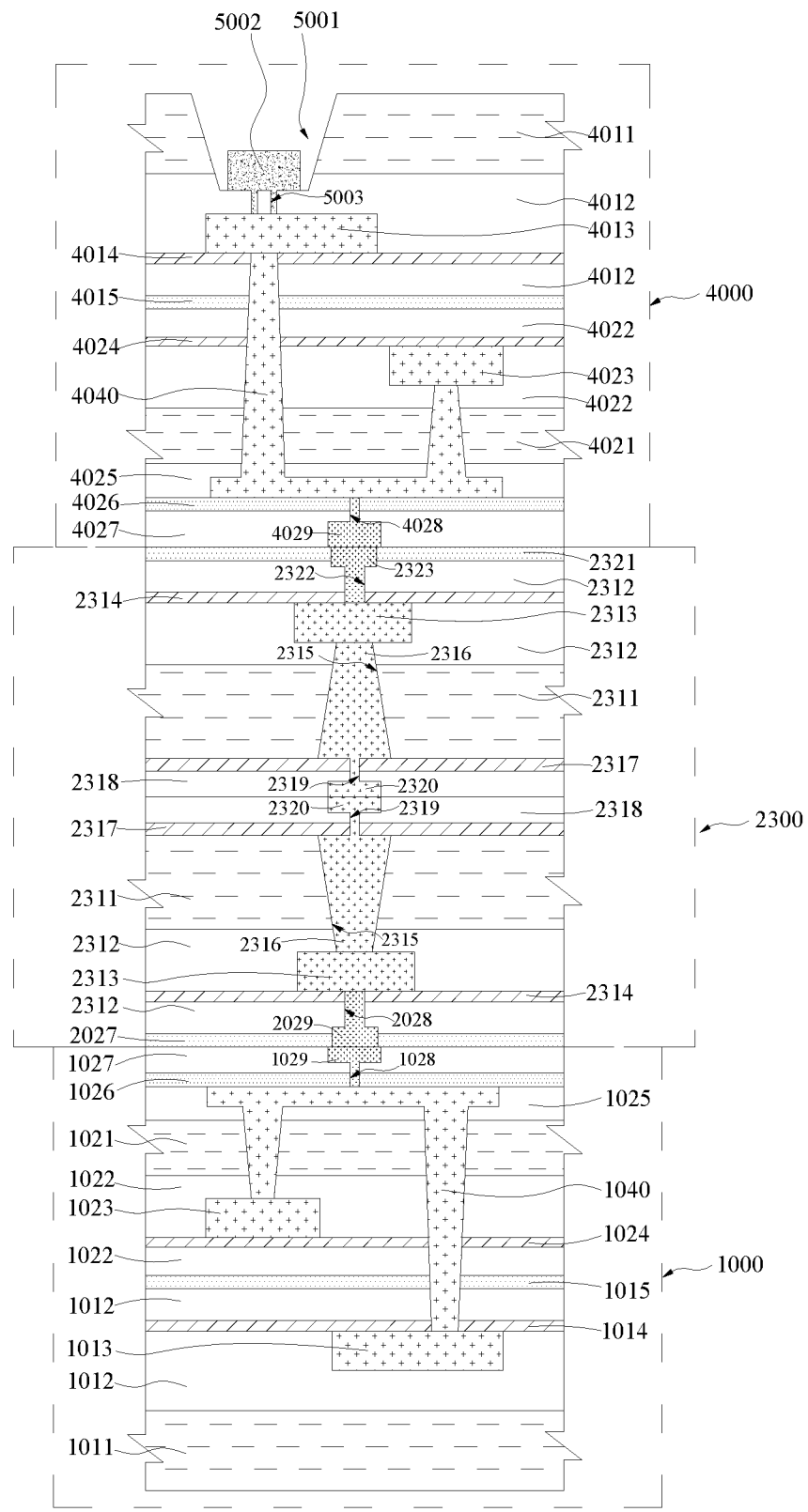
FIG. 8 is a cross-sectional schematic view of a multi-wafer bonding structure according to embodiment 5 of the present invention.

FIG. 8 is a cross-sectional schematic view of a multi-wafer bonding structure of this embodiment. As shown in FIG. 8, a multi-wafer bonding structure includes a first unit 1000, a second unit 2300 and a fourth unit 4000 bonded sequentially. The first unit 1000 includes an upper wafer of the first unit 1020 and a lower wafer of the first unit 1010 that are bonded to each other. The second unit 2300 includes two second unit wafers bonded together. The fourth unit 4000 includes an upper wafer of the fourth unit 4020 and a lower wafer of the fourth unit 4010 that are bonded to each other. In this embodiment, the lower wafer of the first unit 1010, the upper wafer of the first unit 1020, the two second unit wafers, the upper wafer of the fourth unit 4020 and the lower wafer of the fourth unit 4010 are sequentially stacked from bottom to top. The lower wafer of the fourth unit 4010 serves as the topmost wafer of the multi-wafer bonding structure.

The structure of the first unit 1000 of this embodiment is the same as that of embodiment 1, and is not described in detail herein.

The structure of the fourth unit 4000 of this embodiment is the same as that of embodiment 4, and is not described in detail herein.

With continued reference to FIG. 8, the second unit 2300 includes two second unit wafers bonded together. The structure of the second unit wafer of this embodiment is the same as that of embodiment 4, and is not described in detail herein.

Each of the second unit wafers includes a lower passivation layer of the second unit 2321, namely a second passivation layer, located on a dielectric layer 2312 of the second unit, a second unit lower lead-out hole 2322, namely a lead-out hole, penetrating through the lower passivation layer of the second unit 2321 and a portion of the dielectric layer 2312, and a lower bonding layer of the second unit 2323, namely a second bonding layer, filled in the second unit lower lead-out hole 2322. The lower bonding layer of the second unit 2323 is electrically connected to the metal layer 2313 of the second unit wafer.

In the second unit wafer close to the upper wafer of the first unit 1020, the lower passivation layer of the second unit 2321 serves as the second passivation layer 2027, the second unit lower lead-out hole 2322 serves as the second lead-out hole 2028, and the lower bonding layer of the second unit 2323 serves as the second bonding layer 2029.

The lower bonding layer of the second unit 2323 in the second unit wafer close to the fourth unit is in contact with the upper bonding layer of the fourth unit 4029 so as to achieve an electrical connection. The upper bonding layers of the second units 2320 in the two second unit wafers are in contact with each other to achieve an electrical connection. The first bonding layer 1029 is in contact with the second bonding layer 2029 to achieve an electrical connection.

In this embodiment, the 6 wafers (the lower wafer of the first unit 1010, the upper wafer of the first unit 1020, the two second unit wafers, the upper wafer of the fourth unit 4020 and the lower wafer of the fourth unit 4010) are bonded together. The first unit 1000 (the two wafers include a TSV structure) and the second unit 2300 achieve an electrical connection through contacting (terminal to terminal) the first bonding layer 1029 (lead-out terminal of the interconnection layer of the first unit 1040) and the second bonding layer 2029 (lower lead-out terminal of the metal layer 2313 of the second unit wafer). The fourth unit 4000 (the two wafers include a TSV structure) and the second unit 2300 achieve an electrical connection through contacting (terminal to terminal) the upper bonding layer of the fourth unit 4029 (lead-out terminal of interconnection layer of the fourth unit 4040) and the lower bonding layer of the second unit 2323 (lower lead-out terminal of metal layer 2313 of the second unit wafer).

Embodiment 6

Figure 9:
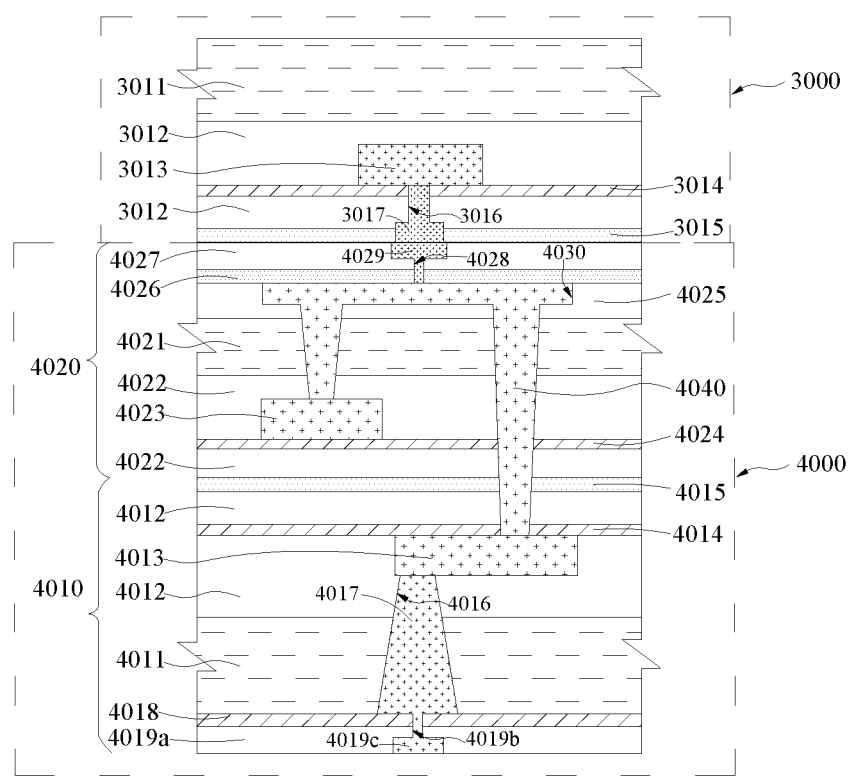
FIG. 9 is a cross-sectional schematic view of a third unit and a fourth unit bonded to each other according to embodiment 6 of the present invention.
Figure 10:
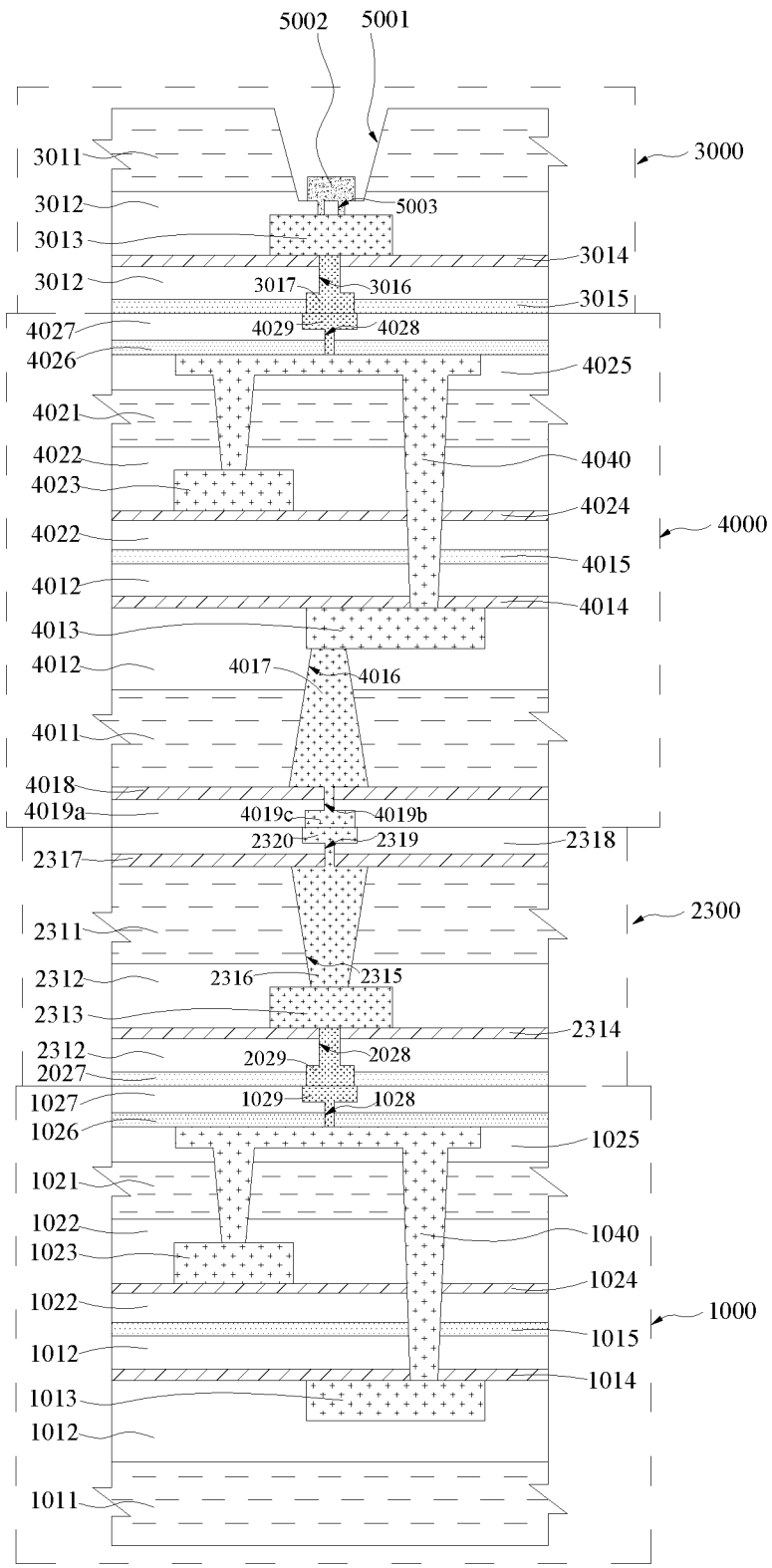
FIG. 10 is a cross-sectional schematic view of a multi-wafer bonding structure according to embodiment 6 of the present invention.

FIG. 9 is a cross-sectional schematic view of a third unit and a fourth unit bonded to each other according to this embodiment, and FIG. 10 is a cross-sectional schematic view of a multi-wafer bonding structure of this embodiment. As shown in FIG. 9 and FIG. 10, a multi-wafer bonding structure includes a first unit 1000, a second unit 2300, a fourth unit 4000 and a third unit 3000 bonded sequentially. The first unit 1000 includes an upper wafer of the first unit 1020 and a lower wafer of the first unit 1010 that are bonded to each other. The second unit 2300 includes a second unit wafer. The fourth unit 4000 includes an upper wafer of the fourth unit 4020 and a lower wafer of the fourth unit 4010 bonded to each other. The third unit 3000 includes a third unit wafer. In this embodiment, the lower wafer of the first unit 1010, the upper wafer of the first unit 1020, the second unit wafer, the lower wafer of the fourth unit 4010, the upper wafer of the fourth unit 4020 and the third unit wafer are sequentially stacked from bottom to top. The third unit wafer serves as the topmost wafer of the multi-wafer bonding structure.

The structure of the first unit 1000 of this embodiment is the same as that of embodiment 1, and is not described in detail herein.

The structure of the second unit 2300 of this embodiment is the same as that of embodiment 4, and is not described in detail herein.

The structure of the third unit 3000 of this embodiment is the same as that of embodiment 3, and is not described in detail herein.

Specifically, as shown in FIG. 9, the fourth unit 4000 includes an upper wafer of the fourth unit 4020 and a lower wafer of the fourth unit 4010 bonded to each other. The upper wafer of the fourth unit 4020 includes a substrate 4021, a dielectric layer 4022 located on a surface of the substrate 4021 and a metal layer 4023 embedded in the dielectric layer 4022. The lower wafer of the fourth unit 4010 includes a substrate 4011, a dielectric layer 4012 located on a surface of the substrate 4011 and a metal layer 4013 embedded in the dielectric layer 4012. The fourth unit 4000 further includes a fourth unit TSV hole 4030 and an interconnection layer of the fourth unit 4040 filled in the fourth unit TSV hole 4030. The interconnection layer of the fourth unit 4040 is respectively electrically connected to a metal layer 4023 of the upper wafer of the fourth unit 4020 and a metal layer 4013 of the lower wafer of the fourth unit 4010 through the fourth unit TSV hole 4030.

The lower wafer of the fourth unit 4010 further includes a fourth unit lower connection hole 4016, namely a fourth unit connection hole, penetrating through the substrate 4011 and exposing the metal layer 4013, a fourth unit lower connection layer 4017, namely a fourth unit connection layer, filled in the fourth unit lower connection hole 4016, a lower passivation layer of the fourth unit 4019a, namely a fourth passivation layer, covering the fourth unit lower connection layer 4017, a fourth unit lower lead-out hole 4019b penetrating through the lower passivation layer of the fourth unit 4019a, and a lower bonding layer of the fourth unit 4019c, namely a fourth bonding layer, filled in the fourth unit lower lead-out hole 4019b. The fourth unit lower lead-out hole 4019b interconnects with the fourth unit lower connection hole 4016. The lower bonding layer of the fourth unit 4019c is electrically connected to the metal layer 4013 of the lower wafer of the fourth unit through the fourth unit lower connection layer 4017.

Preferably, an etching stopping layer 4014 covering the metal layer 4013 is deposited in the dielectric layer 4012; and Preferably, an etching stopping layer 4018 is deposited between the lower passivation layer of the fourth unit 4019a and the fourth unit lower connection layer 4017.

The upper wafer of the fourth unit 4020 further includes an upper passivation layer of the fourth unit 4027 covering the interconnection layer of the fourth unit 4040, a fourth unit upper lead-out hole 4028 penetrating through the upper passivation layer of the fourth unit 4027 and an upper bonding layer of the fourth unit 4029 filled in the fourth unit upper lead-out hole 4028. The upper bonding layer of the fourth unit 4029 is electrically connected to the interconnection layer of the fourth unit 4030.

Further, the upper passivation layer of the fourth unit 4027 is, for example, a silicon nitride layer which is a hard film capable of a better protection for the surface of the wafer.

Further, an isolation layer 4026 is deposited between the interconnection layer of the fourth unit 4040 and the upper passivation layer of the fourth unit 4027. The isolation layer 4026 is, for example, a silicon oxide layer which has a good compactness and a good surface coverage and is used for improving the adhesion of the silicon nitride layer and relieving the stress of the silicon nitride layer, thereby preventing chip breakage on the wafer due to excessive stress on the silicon nitride layer.

Preferably, an etching stopping layer 4024 covering the metal layer 4023 is deposited in the dielectric layer 4022.

The bonding layer of the third unit 3017 is in contact with the upper bonding layer of the fourth unit 4029 to achieve an electrical connection.

With continued reference to FIG. 10, the lower bonding layer of the fourth unit 4019*c* is in contact with the upper bonding layer of the second unit 2320 to achieve an electrical connection. The first bonding layer 1029 is in contact with the second bonding layer 2029 to achieve an electrical connection.

In this embodiment, the 6 wafers (the lower wafer of the first unit 1010, the upper wafer of the first unit 1020, the second unit wafer, the lower wafer of the fourth unit 4010, the upper wafer of the fourth unit 4020 and the third unit wafer) are bonded together. The first unit 1000 (the two wafers include a TSV structure) and the second unit 2300 achieve an electrical connection through contacting (terminal to terminal) the first bonding layer 1029 (lead-out terminal of the interconnection layer of the first unit 1040) and the second bonding layer 2029 (lower lead-out terminal of the metal layer 2313 of the second unit wafer). The fourth unit 4000 (the two wafers include a TSV structure) and the second unit 2300 achieve an electrical connection through contacting (terminal to terminal) the lower bonding layer of the fourth unit 4019*c* (lead-out terminal of the metal layer 4013 of the lower wafer of the fourth unit) and the upper bonding layer of the second unit 2320 (upper lead-out terminal of the metal layer 2313 of the second unit wafer).

Embodiment 7

Figure 11:
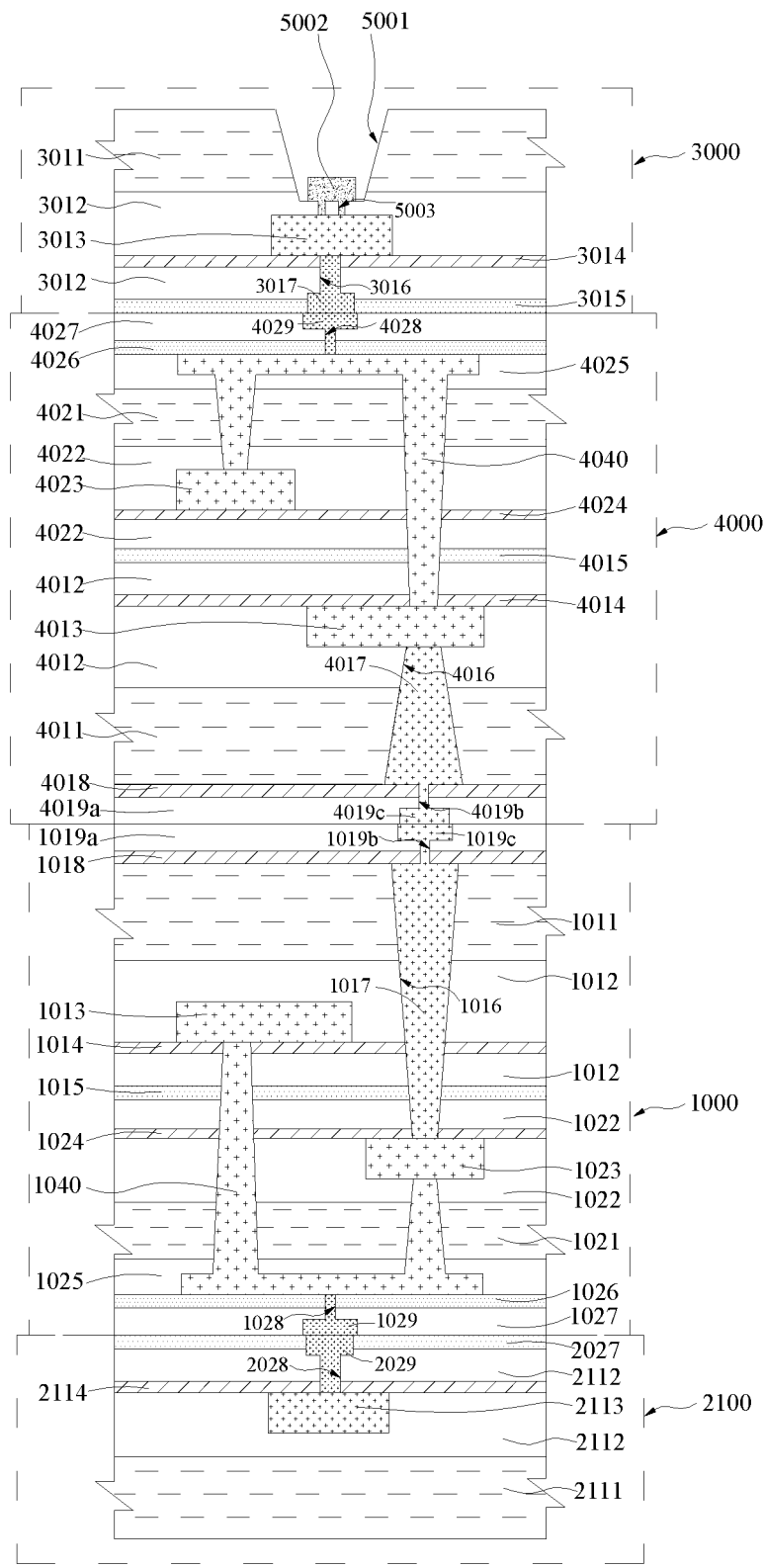
FIG. 11 is a cross-sectional schematic view of a multi-wafer bonding structure according to embodiment 7 of the present invention.

FIG. 11 is a cross-sectional schematic view of a multi-wafer bonding structure of this embodiment. As shown in FIG. 11, a multi-wafer bonding structure includes a second unit 2100, a first unit 1000, a fourth unit 4000 and a third unit 3000 bonded sequentially. The second unit 2100 includes a second unit wafer, the first unit 1000 includes an upper wafer of the first unit 1020 and a lower wafer of the first unit 1010 bonded to each other. The fourth unit 4000 includes an upper wafer of the fourth unit 4020 and a lower wafer of the fourth unit 4010 bonded to each other. The third unit 3000 includes a third unit wafer. In this embodiment, the second unit wafer, the upper wafer of the first unit 1020, the lower wafer of the first unit 1010, the lower wafer of the fourth unit 4010, the upper wafer of the fourth unit 4020 and the third unit wafer are sequentially stacked from bottom to top. The third unit wafer serves as the topmost wafer of the multi-wafer bonding structure.

The structure of the second unit 2100 of this embodiment is the same as that of embodiment 1, and is not described in detail herein.

The structure of the third unit and the fourth unit bonded to each other according to this embodiment is the same as those of embodiment 6, and is not described in detail herein.

The structure of the first unit 1000 of this embodiment is similar to that of the first unit in embodiment 1 shown in FIG. 1, and the difference is: the first unit 1000 further includes a first unit first connection hole 1016, namely a first unit connection hole, penetrating through the lower wafer of the first unit 1010 and a portion of the dielectric layer 1022, a first unit first connection layer 1017, namely a first unit connection layer, filled in the first unit first connection hole 1016, a first unit lower passivation layer 1019*a*, namely an additional first passivation layer, covering the first unit first connection layer 1017, a first unit lower lead-out hole 1019*b*, namely an additional first lead-out hole, penetrating through the first unit lower passivation layer 1019*a* and a first unit lower bonding layer 1019*c*, namely an additional first bonding layer, filled in the first unit lower lead-out hole 1019*b*. The first unit lower lead-out hole 1019*b* interconnects with the first unit first connection hole 1016. The first unit lower bonding layer 1019*c* is electrically connected to the metal layer 1023 of the upper wafer of the first unit, namely a first wafer of the first unit, through the first unit first connection layer 1017.

The lower bonding layer of the fourth unit 4019*c* is in contact with the first unit lower bonding layer 1019*c* to achieve an electrical connection. The first bonding layer 1029 is in contact with the second bonding layer 2029 to achieve an electrical connection.

In this embodiment, the 6 wafers (the second unit wafer, the upper wafer of the first unit 1020, the lower wafer of the first unit 1010, the lower wafer of the fourth unit 4010, the upper wafer of the fourth unit 4020 and the third unit wafer) are bonded together The first unit 1000 (the two wafers include a TSV structure) and the second unit 2100 achieve an electrical connection through contacting (terminal to terminal) the first bonding layer 1029 (lead-out terminal of the interconnection layer of the first unit 1040) and the second bonding layer 2029 (lead-out terminal of the metal layer 2113 of the second unit wafer). The fourth unit 4000 (the two wafers include a TSV structure) and the first unit 1000 (the two wafers include a TSV structure) achieve an electrical connection through contacting (terminal to terminal) the lower bonding layer of the fourth unit 4019*c* (lead out terminal of the metal layer 4013 of the lower wafer of the fourth unit) and the first unit lower bonding layer 1019*c* (lead-out terminal of the metal layer 1023 of the upper wafer of the first unit 1020).

Embodiment 8

Figure 12:
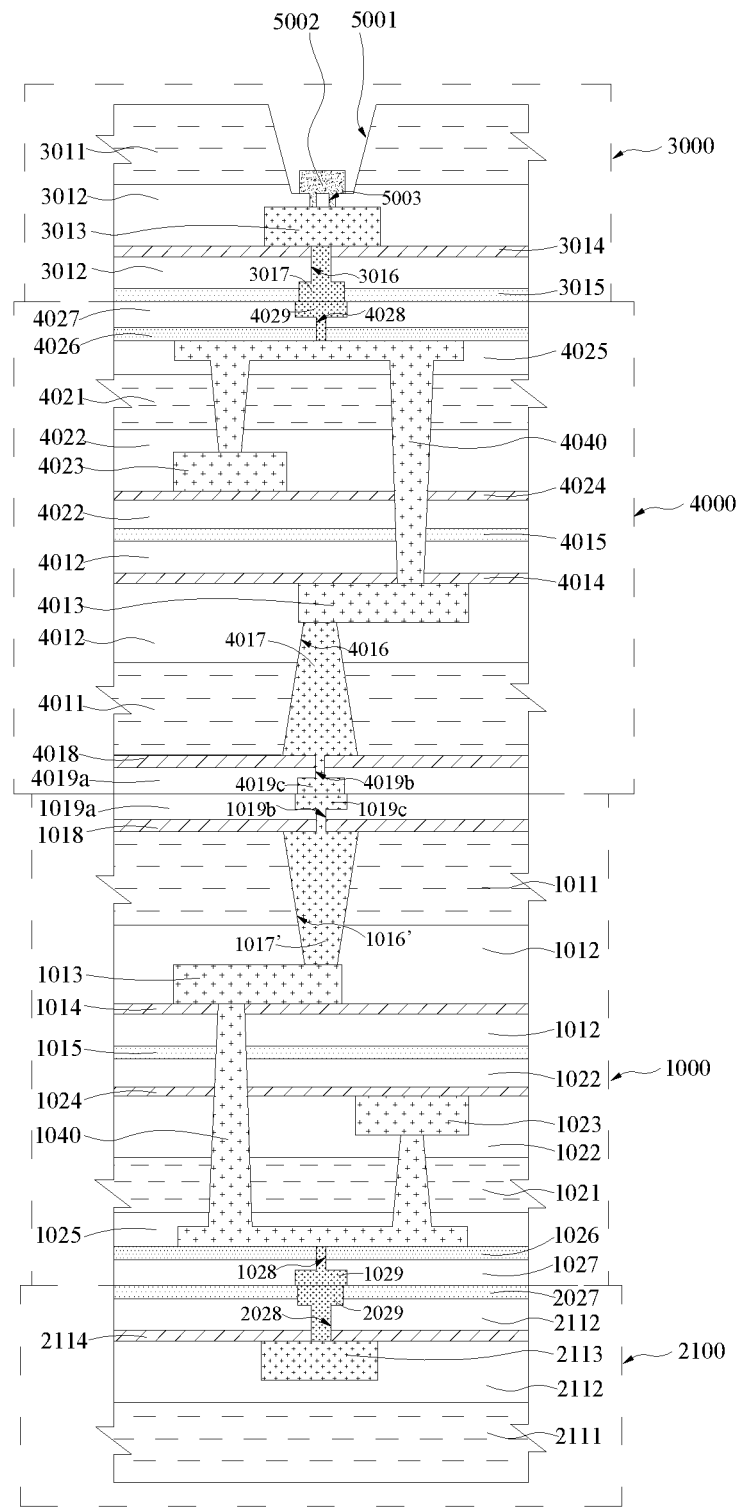
FIG. 12 is a cross-sectional schematic view of a multi-wafer bonding structure according to embodiment 8 of the present invention.

FIG. 12 is a cross-sectional schematic view of a multi-wafer bonding structure of this embodiment. As shown in FIG. 12, a multi-wafer bonding structure includes a second unit 2100, a first unit 1000, a fourth unit 4000 and a third unit 3000 bonded sequentially. The second unit 2100 includes a second unit wafer. The first unit 1000 includes an upper wafer of the first unit 1020 and a lower wafer of the first unit 1010 bonded to each other. The fourth unit 4000 includes an upper wafer of the fourth unit 4020 and a lower wafer of the fourth unit 4010 bonded to each other. The third unit 3000 includes a third unit wafer. In this embodiment, the second unit wafer, the upper wafer of the first unit 1020, the lower wafer of the first unit 1010, the lower wafer of the fourth unit 4010, the upper wafer of the fourth unit 4020 and the third unit wafer are sequentially stacked from bottom to top. The third unit wafer serves as the topmost wafer of the multi-wafer bonding structure.

The structure of the second unit 2100 of this embodiment is the same as that of embodiment 1, and is not described in detail herein.

The structure of the third unit and the fourth unit bonded to each other according to this embodiment is the same as those of embodiment 6, and is not described in detail herein.

The structure of the first unit 1000 of this embodiment is similar to that of the first unit in embodiment 1 shown in FIG. 1, and the difference is: the first unit 1000 further includes a first unit second connection hole 1016', namely a first unit connection layer, penetrating through the substrate 1011 and a portion of the dielectric layer 1012 of the lower wafer of the first unit, a first unit second connection layer 1017' filled in the first unit second connection hole 1016', a first unit lower passivation layer 1019a covering the first unit second connection layer 1017', a first unit lower lead-out hole 1019b penetrating through the first unit lower passivation layer 1019a and a first unit lower bonding layer 1019c filled in the first unit lower lead-out hole 1019b. The first unit lower lead-out hole 1019b interconnects with the first unit second connection hole 1016'. The first unit lower bonding layer 1019c is electrically connected to the metal layer 1013 of the lower wafer of the first unit through the first unit second connection layer 1017'.

The lower bonding layer of the fourth unit 4019c is in contact with the first unit lower bonding layer 1019c to achieve an electrical connection. The first bonding layer 1029 is in contact with the second bonding layer 2029 to achieve an electrical connection.

In this embodiment, the 6 wafers (the second unit wafer, the upper wafer of the first unit 1020, the lower wafer of the first unit 1010, the lower wafer of the fourth unit 4010, the upper wafer of the fourth unit 4020 and the third unit wafer) are bonded together. The first unit 1000 (the two wafers include a TSV structure) and the second unit 2100 achieve an electrical connection through contacting (terminal to terminal) the first bonding layer 1029 (lead-out terminal of the interconnection layer of the first unit 1040) and the second bonding layer 2029 (lead-out terminal of the metal layer 2113 of the second unit wafer). The fourth unit 4000 (the two wafers include a TSV structure) and the first unit 1000 (the two wafers include a TSV structure) achieve and electrical connection through contacting (terminal to terminal) the lower bonding layer of the fourth unit 4019c (lead-out terminal of the metal layer 4013 of the lower wafer of the fourth unit) and the first unit lower bonding layer 1019c (lead-out terminal of the metal layer 1013 of the lower wafer of the first unit 1010).

Embodiments 6 to 8 each includes the first unit 1000 (the two wafers includes a TSV structure), wherein: the first bonding layer 1029 in embodiment 6 is the lead-out terminal of the interconnection layer 1040; the first unit lower bonding layer 1019c in embodiment 7 is the lead-out terminal of the metal layer 1023 of the upper wafer of the first unit 1020; and the first unit lower bonding layer 1019c in embodiment 8 is the lead-out terminal of the metal layer 1013 of the lower wafer of the first unit 1010.

It can be seen that according to the embodiments of the present invention, a bonding layer led out from any one of the three metal layers (the metal layer 1023 of the upper wafer of the first unit 1020, the metal layer 1013 of the lower wafer of the first unit 1010 and the interconnection layer of the first unit 1040) in the first unit 1000 (the two wafers include a TSV structure) can be bonded to other units so as to achieve an electrical connection such that a higher flexibility can be enabled. Correspondingly, the embodiments of the present invention can be flexibly applied to other bonding units including a TSV structure comprised of two similar wafers.

Embodiment 9

Figure 13:
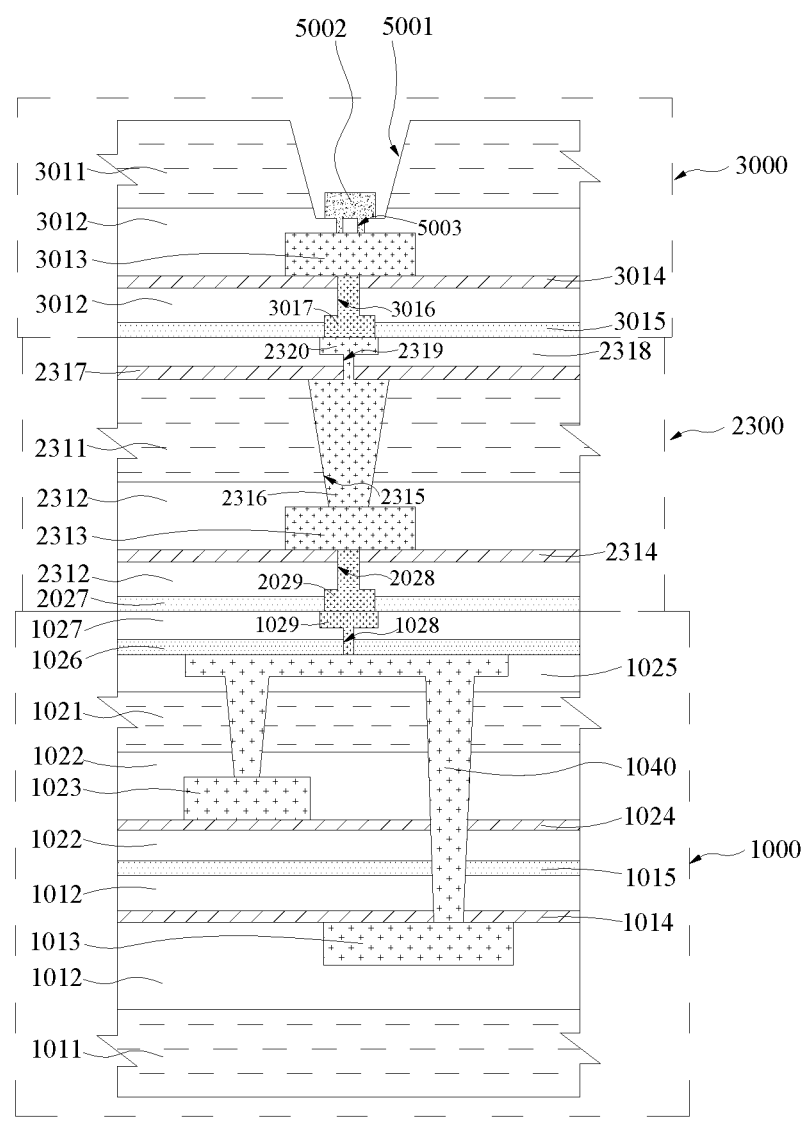
FIG. 13 is a cross-sectional schematic view of a multi-wafer bonding structure according to embodiment 9 of the present invention.

As shown in FIG. 13, a multi-wafer bonding structure of embodiment 9 of the present invention includes a first unit 1000, a second unit 2300 and a third unit 3000 bonded sequentially.

The first unit 1000 includes an upper wafer of the first unit 1020 and a lower wafer of the first unit 1010 bonded to each other. The second unit 2300 includes a second unit wafer. The third unit 3000 includes a third unit wafer. In this embodiment, the lower wafer of the first unit 1010, the upper wafer of the first unit 1020, the second unit wafer and the third unit wafer are sequentially stacked from bottom to top. The third unit wafer serves as the topmost wafer of the multi-wafer bonding structure.

The structure of the first unit 1000 of this embodiment is the same as that of embodiment 1, and is not described in detail herein.

The structure of the second unit 2300 of this embodiment is the same as that of embodiment 4, and is not described in detail herein.

The structure of the third unit 3000 of this embodiment is the same as that of embodiment 3, and is not described in detail herein.

The bonding layer of the third unit 3017 is in contact with the upper bonding layer of the second unit 2320 to achieve an electrical connection. The first bonding layer 1029 is in contact with the second bonding layer 2029 to achieve an electrical connection.

In this embodiment, the 4 wafers (the lower wafer of the first unit 1010, the upper wafer of the first unit 1020, the second unit wafer and the third unit wafer) are bonded together. The first unit 1000 (the two wafers include a TSV structure) and the second unit 2300 achieve an electrical connection through contacting (terminal to terminal) the first bonding layer 1029 (lead-out terminal of the interconnection layer of the first unit 1040) and the second bonding layer 2029 (lead-out terminal of the metal layer 2313).

The multi-wafer bonding structures in embodiments 1 to 9 of the present invention each include a first trench 5001 and a lead-out layer 5002. The first trench 5001 penetrates through the substrate and a portion of the dielectric layer of the topmost wafer in the multi-wafer bonding structure and located above the metal layer of the topmost wafer. The lead-out layer 5002 is formed at the bottom of the first trench 5001 and electrically connected to the metal layer of the topmost wafer. Compared to the conventional process, forming the lead-out layer at the bottom of the first trench eliminates the process of firstly filling the whole trench with a metal layer (e.g., copper) and then forming the filling metal layer (e.g., copper) in the lead-out layer, thereby being favorable for reducing the cost.

Further, the multi-wafer bonding structures in embodiments 1 to 9 of the present invention each further includes a first opening 5003. The first opening 5003 is located at the bottom of the first trench 5001 and interconnects with the first trench 5001. The first opening 5003 is located above the metal layer of the topmost wafer and exposes the metal layer of the topmost wafer. The lead-out layer 5002 is electrically connected to the metal layer of the topmost wafer through the first opening 5003.

The multi-wafer bonding structures in embodiments 1 to 9 of the present invention are typical multi-wafer bonding structures of the present invention. Under the allowance of the total thickness of the stacked multi-wafers according to the multi-wafer bonding structures in embodiments 1 to 9 of the present invention, the multi-wafer bonding structure of the respective embodiments may be repeatedly stacked and bonded, or the multi-wafer bonding structures of different embodiments may be combined and stacked in the multi-wafer bonding structures of embodiments 1 to 9 to form the final multi-wafer bonding structure.

In the multi-wafer bonding structure of the embodiments of the present invention, the wafers therein may be wafers having the same function or wafers having different functions. The wafers having different functions are bonded and packaged together such that the product functions of the multi-wafer bonding structure are better and diversified.

It should be understood that the terms "first", "second", "third", "fourth" and the like are used herein to distinguish different components or techniques having the same name, and do not mean a sequence or a positional relationship or the like. In addition, the various components having the same name are not meant to have the same structure or component. For example, although not shown in the drawings, in most cases, the components formed in different wafers are different, and the structure of the substrate may be different. In some implementations, the substrate may be a semiconductor substrate made of any semiconductor material (e.g., Si, SiC, SiGe, etc.) suitable for a semiconductor device. In other implementations, the substrate may also be a composite substrate such as silicon-on-insulator (SOI), silicon germanium-on-insulator, or the like. Those skilled in the art will understand that the substrate is not subject to any restrictions, but may be selected according to practical applications. Various devices (not limited to semiconductor devices) components (not shown) may be formed in the substrate. The substrate may also have been formed with other layers or components, such as gate structures, contact openings, dielectric layers, metal connecting wires, through openings, and the like.

The various embodiments in the present specification are described in a progressive manner, and each embodiment focuses on differences from other embodiments, and the same or similar parts between the various embodiments may be referred to each other. For the method disclosed in the embodiment, since it corresponds to the structure disclosed in the embodiment, the description is relatively simple, and the relevant parts can be referred to the description of the structure.

The above description is only for the description of the preferred embodiments of the present invention, and is not intended to limit the scope of the present invention. Any changes and modifications made by those skilled in the art in light of the above disclosure are all within the scope of the appended claims.

What is claimed is:

1. A multi-wafer bonding structure, comprising: a first unit and a second unit, wherein:
   the first unit comprises a first wafer of the first unit and a second wafer of the first unit that are bonded to each other; the second unit comprises at least one second unit wafer; the first wafer of the first unit and the second unit are bonded to each other; each wafer in the multi-wafer bonding structure comprises a substrate, a dielectric layer located on a surface of the substrate, and a metal layer embedded in the dielectric layer;
   the first unit further comprises a first unit TSV hole and a first unit interconnection layer filling the first unit TSV hole; the first unit interconnection layer in the first unit TSV hole is electrically connected to a metal layer of the first wafer of the first unit and a metal layer of the second wafer of the first unit; the first wafer of the first unit further comprises a first passivation layer covering the first unit interconnection layer, a first lead-out hole penetrating through the first passivation layer, and a first bonding layer filling the first lead-out hole; the first bonding layer is in contact with the first unit interconnection layer so as to achieve an electrical connection;
   the at least one second unit wafer and bonded to the first wafer of the first unit further comprises a second passivation layer, a second lead-out hole penetrating through the second passivation layer, and a second bonding layer filling the second lead-out hole; the second bonding layer is electrically connected to a metal layer of the at least one second unit wafer and bonded to the first wafer of the first unit; the first bonding layer is in contact with the second bonding layer so as to achieve an electrical connection; and
   the multi-wafer bonding structure further comprises a first trench and a lead-out layer; the first trench penetrates through the substrate and a portion of the dielectric layer of a topmost wafer in the multi-wafer bonding structure and is located above the metal layer of the topmost wafer; the metal layer of the topmost wafer is electrically connected to the second bonding layer; and the lead-out layer is formed at a bottom of the first trench and is electrically connected to the metal layer of the topmost wafer.

2. The multi-wafer bonding structure according to claim 1, wherein:
   the second unit comprises only one second unit wafer which is bonded to the first wafer of the first unit and comprises the second passivation layer, the second lead-out hole and the second bonding layer; the second passivation layer of the second unit wafer covers a dielectric layer of the second unit wafer; the second lead-out hole penetrates through the second passivation layer and a portion of the dielectric layer of the second unit wafer; the second bonding layer fills the second lead-out hole and is electrically connected to the metal layer of the second unit wafer; and the second unit wafer serves as the topmost wafer in the multi-wafer bonding structure.

3. The multi-wafer bonding structure according to claim 1, wherein:
   the second unit comprises two second unit wafers including a third wafer of the second unit and a fourth wafer of the second unit that are bonded to each other; the second unit further comprises a second unit TSV hole and a second unit interconnection layer filling the second unit TSV hole; and the second unit interconnection layer is electrically connected to metal layers of the third and fourth wafers of the second unit.

4. The multi-wafer bonding structure according to claim 3, wherein:
   the third wafer of the second unit is bonded to the first wafer of the first unit and comprises the second passivation layer, the second lead-out hole and the second bonding layer;
   the second passivation layer of the third wafer of the second unit covers the second unit interconnection layer; the second lead-out hole penetrates through the second passivation layer;
   and the second bonding layer fills the second lead-out hole and is electrically connected to the second unit interconnection layer; and the fourth wafer of the second unit serves as the topmost wafer in the multi-wafer bonding structure.

5. The multi-wafer bonding structure according to claim 3, wherein:
the multi-wafer bonding structure further comprises a third unit; the third unit comprises a third unit wafer; the third wafer of the second unit is bonded to the third unit wafer; and the fourth wafer of the second unit is bonded to the first wafer of the first unit and comprises the second passivation layer, the second lead-out hole and the second bonding layer;
the fourth wafer of the second unit further comprises: a second unit connection hole penetrating through a substrate of the fourth wafer of the second unit and exposing the metal layer of the fourth wafer of the second unit, and a second unit connection layer filling the second unit connection hole;
the second passivation layer in the fourth wafer of the second unit covers the second unit connection layer; the second lead-out hole penetrates through the second passivation layer and interconnects with the second unit connection hole; and the second bonding layer fills the second lead-out hole and is electrically connected to the metal layer of the fourth wafer of the second unit through the second unit connection layer;
the third wafer of the second unit further comprises: an additional second passivation layer covering the second unit interconnection layer, an additional second lead-out hole penetrating through the additional second passivation layer, and an additional second bonding layer filling the additional second lead-out hole, the additional second bonding layer electrically connected to the second unit interconnection layer;
the third unit wafer further comprises: a third passivation layer covering a dielectric layer of the third unit wafer, a third lead-out hole penetrating through the third passivation layer and a portion of the dielectric layer of the third unit wafer, and a third bonding layer filling the third lead-out hole, the third bonding layer electrically connected to a metal layer of the third unit wafer;
the third bonding layer is in contact with the additional second bonding layer of the second unit so as to achieve an electrical connection; and
the third unit wafer serves as the topmost wafer in the multi-wafer bonding structure.

6. The multi-wafer bonding structure according to claim 1, wherein:
the multi-wafer bonding structure further comprises a fourth unit; the fourth unit comprises a fifth wafer of the fourth unit and a sixth wafer of the fourth unit that are bonded to each other; the fourth unit further comprises a fourth unit TSV hole and a fourth unit interconnection layer filling the fourth unit TSV hole; the fourth unit interconnection layer in the fourth unit TSV hole is electrically connected to metal layers of the fifth wafer of the fourth unit and the sixth wafer of the fourth unit.

7. The multi-wafer bonding structure according to claim 6, wherein:
the first, second and fourth units are stacked and bonded one above another;
the second unit comprises only one second unit wafer that comprises the second passivation layer, the second lead-out hole and the second bonding layer, wherein the second passivation layer covers a dielectric layer of the second unit wafer; the second lead-out hole penetrates through the second passivation layer and a portion of the dielectric layer of the second unit wafer; and the second bonding layer fills the second lead-out hole and is electrically connected to the metal layer of the second unit wafer;
the second unit wafer further comprises: a second unit connection hole penetrating through a substrate of the second unit wafer and exposing the metal layer of the second unit wafer, a second unit connection layer filling the second unit connection hole, an additional second passivation layer covering the second unit connection layer, an additional second lead-out hole penetrating through the additional second passivation layer, and an additional second bonding layer filling the additional second lead-out hole;
the additional second bonding layer is electrically connected to the metal layer of the second unit wafer through the second unit connection layer;
the fifth wafer of the fourth unit further comprises: a fourth passivation layer covering the fourth unit interconnection layer, a fourth lead-out hole penetrating through the fourth passivation layer and a fourth bonding layer filling the fourth lead-out hole, the fourth bonding layer electrically connected to the fourth unit interconnection layer;
the fourth bonding layer of the fourth unit is in contact with the additional second bonding layer of the second unit so as to achieve an electrical connection; and
the sixth wafer of the fourth unit serves as the topmost wafer in the multi-wafer bonding structure.

8. The multi-wafer bonding structure according to claim 6, wherein:
the first, second and fourth units are stacked and bonded one above another;
the second unit comprises two second unit wafers including a third wafer and a fourth wafer that are bonded together;
the third wafer of the second unit is bonded to the first wafer of the first unit and comprises the second passivation layer, the second lead-out hole and the second bonding layer;
the third wafer further comprises: a second unit connection hole penetrating through a substrate of the third wafer and exposing a metal layer of the third wafer, a second unit connection layer filling the second unit connection hole, an additional second passivation layer covering the second unit connection layer, an additional second lead-out hole penetrating through the additional second passivation layer, and a additional second bonding layer filling the additional second lead-out hole; the additional second bonding layer is electrically connected to the metal layer of the third wafer through the second unit connection layer;
the fourth wafer of the second unit comprises: an upper passivation layer located on a dielectric layer of the fourth wafer, an upper lead-out hole penetrating through the upper passivation layer and a portion of the dielectric layer of the fourth wafer, and an upper bonding layer filling the upper lead-out hole; the upper bonding layer is electrically connected to the metal layer of the fourth wafer; the fourth wafer further comprises an additional second unit connection hole penetrating through a substrate of the fourth wafer and exposing a metal layer of the fourth wafer, an additional second unit connection layer filling the additional second unit connection hole, a lower passivation layer covering the additional second unit connection layer, a lower lead-out hole penetrating through the lower passivation layer, and a lower bonding layer filling the lower lead-out hole, the lower bonding layer electrically connected to the additional second bonding layer of the third wafer;

the fifth wafer of the fourth unit further comprises: an additional fourth passivation layer covering the fourth unit interconnection layer, an additional fourth lead-out hole penetrating through the additional fourth passivation layer, and an additional fourth bonding layer filling the additional fourth lead-out hole, the additional fourth bonding layer electrically connected to the fourth unit interconnection layer of the;

the upper bonding layer of the fourth wafer of the second unit is in contact with the additional fourth bonding layer of the fifth wafer of the fourth unit so as to achieve an electrical connection; and the sixth wafer of the fourth unit serves as the topmost wafer in the multi-wafer bonding structure.

9. The multi-wafer bonding structure according to claim 1, wherein:

the multi-wafer bonding structure further comprises a third unit and a fourth unit that are bonded to each other;

the third unit comprises a third unit wafer; the third unit wafer comprises: a third passivation layer covering a dielectric layer of the third unit wafer, a third lead-out hole penetrating through the third passivation layer and a portion of the dielectric layer of the third unit wafer, and a third bonding layer filling the third lead-out hole, the third bonding layer electrically connected to a metal layer of the third unit wafer;

the fourth unit comprises a fifth wafer of the fourth unit and a sixth wafer of the fourth unit that are bonded to each other; the fourth unit further comprises a fourth unit TSV hole and a fourth unit interconnection layer filling the fourth unit TSV hole; the fourth unit interconnection layer in the fourth unit TSV hole is electrically connected to metal layers of the fifth and sixth wafers;

the sixth wafer of the fourth unit further comprises: a fourth unit connection hole penetrating through a substrate of the sixth wafer of the fourth unit and exposing the metal layer of the sixth wafer of the fourth unit, a fourth unit connection layer filling the fourth unit connection hole, a fourth passivation layer covering the fourth unit connection layer, a fourth lead-out hole penetrating through the fourth passivation layer, and a fourth bonding layer filling the fourth lead-out hole; the fourth lead-out hole interconnects with the fourth unit connection hole; and the fourth bonding layer is electrically connected to the metal layer of the sixth wafer of the fourth unit through the fourth unit connection layer;

the fifth wafer of the fourth unit further comprises: an additional fourth passivation layer covering the fourth unit interconnection layer, an additional fourth lead-out hole penetrating through the additional fourth passivation layer, and an additional fourth bonding layer filling the additional fourth lead-out hole, the additional fourth bonding layer electrically connected to the fourth unit interconnection layer; and the third bonding layer of the third unit is in contact with the additional fourth bonding layer of the fifth wafer of the fourth unit so as to achieve an electrical connection.

10. The multi-wafer bonding structure according to claim 9, wherein:

the first, second, fourth and third units are stacked and bonded one above another;

the second unit comprises only one second unit wafer which is bonded to the first wafer of the first unit and comprises the second passivation layer, the second lead-out hole and the second bonding layer; the second unit wafer further comprises: a second unit connection hole penetrating through a substrate of the second unit wafer and exposing a metal layer of the second unit wafer, a second unit connection layer filling the second unit connection hole, an additional second passivation layer covering the second unit connection layer, an additional second lead-out hole penetrating through the additional second passivation layer, and an additional second bonding layer filling the additional second lead-out hole;

the additional second bonding layer is electrically connected to the metal layer of the second unit wafer through the second unit connection layer;

the second passivation layer in the second unit wafer covers a dielectric layer of the second unit wafer; the second lead-out hole penetrates through the second passivation layer and a portion of the dielectric layer of the second unit wafer; and the second bonding layer fills the second lead-out hole and is electrically connected to the metal layer of the second unit wafer;

the fourth bonding layer of the sixth wafer of the fourth unit is in contact with the additional second bonding layer of the second unit wafer so as to achieve an electrical connection; and the third unit wafer serves as the topmost wafer in the multi-wafer bonding structure.

11. The multi-wafer bonding structure according to claim 9, wherein:

the second, first, fourth and third units are stacked and bonded one above another;

the second unit comprises only one second unit wafer which is bonded to the first wafer of the first unit and comprises the second passivation layer, the second lead-out hole and the second bonding layer; the second passivation layer in the second unit wafer covers a dielectric layer of the second unit wafer; the second lead-out hole penetrates through the second passivation layer and a portion of the dielectric layer of the second unit wafer; and the second bonding layer fills the second lead-out hole and is electrically connected to the metal layer of the second unit wafer and the first bonding layer of the first wafer of the first unit;

the first unit further comprises: a first unit connection hole penetrating through the second wafer of the first unit and a portion of the dielectric layer of the first wafer of the first unit, and a first unit connection layer filling the first unit connection hole; the first unit connection hole exposes a metal layer of the first wafer of the first unit;

the first unit further comprises an additional first passivation layer covering the first unit connection layer, an additional first lead-out hole penetrating through the additional first passivation layer, and an additional first bonding layer filling the additional first lead-out hole;

the additional first lead-out hole interconnects with the first unit connection hole; the additional first bonding layer is electrically connected to the metal layer of the first wafer of the first unit through the first unit connection layer;

the fourth bonding layer of the fifth wafer of the fourth unit is in contact with the additional first bonding layer of the first unit to achieve an electrical connection; and the third unit wafer serves as the topmost wafer in the multi-wafer bonding structure.

12. The multi-wafer bonding structure according to claim 9, wherein:
- the second, first, fourth and third units are stacked and bonded one above another;
- the second unit comprises only one second unit wafer which is bonded to the first wafer of the first unit and comprises the second passivation layer, the second lead-out hole and the second bonding layer; the second passivation layer in the second unit wafer covers a dielectric layer of the second unit wafer; the second lead-out hole penetrates through the second passivation layer and a portion of the dielectric layer of the second unit wafer; and the second bonding layer fills the second lead-out hole and is electrically connected to the metal layer of the second unit wafer and the first bonding layer of the first wafer of the first unit;
- the first unit further comprises: a first unit connection hole penetrating through a substrate and a portion of a dielectric layer of the second wafer of the first unit, and a first unit connection layer filling the first unit connection hole; the first unit connection hole exposes a metal layer of the second wafer of the first unit;
- the first unit further comprises: an additional first passivation layer covering the first unit connection layer, an additional first lead-out hole penetrating through the additional first passivation layer, and an additional first bonding layer filling the additional first lead-out hole;
- the additional first lead-out hole interconnects with the first unit connection hole; the additional first bonding layer is electrically connected to the metal layer of the second wafer of the first unit through the first unit connection layer;
- the fourth bonding layer of the fifth wafer of the fourth unit is in contact with the additional first bonding layer of the first unit so as to achieve an electrical connection; and
- the third unit wafer serves as the topmost wafer in the multi-wafer bonding structure.

13. The multi-wafer bonding structure according to claim 1, wherein:
- the multi-wafer bonding structure further comprises a third unit; the first, second and third units are stacked and bonded one above another;
- the second unit comprises only one second unit wafer which is bonded to the first wafer of the first unit and comprises the second passivation layer, the second lead-out hole and the second bonding layer; the second unit wafer further comprises: a second unit connection hole penetrating through a substrate of the second unit wafer and exposing the metal layer of the second unit wafer, a second unit connection layer filling the second unit connection hole, an additional second passivation layer covering the second unit connection layer, an additional second lead-out hole penetrating through the additional second passivation layer, and an additional second bonding layer filling the additional second lead-out hole;
- the additional second bonding layer is electrically connected to the metal layer of the second unit wafer through the second unit connection layer;
- the second passivation layer in the second unit covers a dielectric layer of the second unit wafer; the second lead-out hole penetrates through the second passivation layer and a portion of the dielectric layer of the second unit wafer; and the second bonding layer fills the second lead-out hole and is electrically connected to the metal layer of the second unit wafer;
- the third unit comprises a third unit wafer and further comprises: a third passivation layer covering a dielectric layer of the third unit wafer, a third lead-out hole penetrating through the third passivation layer and a portion of the dielectric layer of the third unit wafer, and a third bonding layer filling the third lead-out hole, the third bonding layer electrically connected to a metal layer of the third unit wafer;
- the third bonding layer is in contact with the additional second bonding layer of the second unit so as to achieve an electrical connection; and
- the third unit wafer serves as the topmost wafer in the multi-wafer bonding structure.

14. A method for bonding a multi-wafer, comprising:
- providing a first unit, wherein the first unit comprises a first wafer of the first unit and a second wafer of the first unit that are bonded to each other; each of the first and second wafers of the first unit comprises a substrate, a dielectric layer located on a surface of the substrate and a metal layer entirely embedded in the dielectric layer; the first unit further comprises a first unit TSV hole and a first unit interconnection layer filling the first unit TSV hole; the first unit interconnection layer in the first unit TSV hole is electrically connected to a metal layer of the first wafer of the first unit and a metal layer of the second wafer of the first unit; the first wafer of the first unit further comprises a first passivation layer covering the first unit interconnection layer, a first lead-out hole penetrating through the first passivation layer, and a first bonding layer filling the first lead-out hole, the first bonding layer being in contact with the first unit interconnection layer so as to achieve an electrical connection;
- providing a second unit, wherein the second unit comprises at least one second unit wafer, each of the at least one second unit wafer comprising a substrate, a dielectric layer located on a surface of the substrate and a metal layer embedded in the dielectric layer; one of the at least one second unit wafer to be bonded to the first wafer of the first unit further comprises a second passivation layer, a second lead-out hole penetrating through the second passivation layer and a second bonding layer filling the second lead-out hole, the second bonding layer electrically connected to the metal layer of the one of the at least one second unit wafer;
- bonding the first unit and the second unit to form a multi-wafer bonding structure, wherein the first wafer of the first unit and the one of the at least one second unit wafer are bonded to each other, the first bonding layer being in contact with the second bonding layer so as to achieve an electrical connection; and
- forming a first trench and a lead-out layer, wherein the first trench penetrates through the substrate and a portion of the dielectric layer of a topmost wafer in the multi-wafer bonding structure and is located above a metal layer of the topmost wafer, the metal layer of the topmost wafer electrically connected to the second bonding layer, the lead-out layer being formed at a bottom of the first trench and electrically connected to the metal layer of the topmost wafer.

15. The method according to claim 14, wherein the second unit comprises only one second unit wafer which is bonded to the first wafer of the first unit and comprises the second passivation layer, the second lead-out hole and the second bonding layer;

the second passivation layer in the second unit wafer covers a dielectric layer of the second unit wafer; the second lead-out hole penetrates through the second passivation layer and a portion of the dielectric layer of the second unit wafer; the second bonding layer fills the second lead-out hole and is electrically connected to the metal layer of the second unit wafer; and the second unit wafer serves as the topmost wafer in the multi-wafer bonding structure.

16. The method according to claim 14, wherein the second unit comprises two second unit wafers including a third wafer and a fourth wafer that are bonded to each other; the second unit further comprises a second unit TSV hole and a second unit interconnection layer filling the second unit TSV hole; and the second unit interconnection layer in the second unit TSV hole is electrically connected to the metal layers of the third and fourth wafers of the second unit.

17. The method according to claim 16, wherein the third wafer is bonded to the first wafer of the first unit and comprises the second passivation layer, the second lead-out hole and the second bonding layer; the second passivation layer in the third wafer of the second unit covers the second unit interconnection layer, the second lead-out hole penetrating through the second passivation layer, the second bonding layer filling the second lead-out hole and electrically connected to the second unit interconnection layer; and the fourth wafer of the second unit serves as the topmost wafer in the multi-wafer bonding structure.

18. The method according to claim 16, wherein the fourth wafer of the second unit is bonded to the first wafer of the first unit and comprises the second passivation layer, the second lead-out hole and the second bonding layer, wherein the method further comprises, prior to forming the first trench and the lead-out layer:

providing a third unit, wherein the third unit comprises a third unit wafer; the third unit wafer comprises: a substrate, a dielectric layer located on a surface of the substrate, a metal layer embedded in the dielectric layer, a third passivation layer covering the dielectric layer of the third unit wafer, a third lead-out hole penetrating through the third passivation layer and a portion of the dielectric layer of the third unit wafer, and a third bonding layer filling the third lead-out hole, the third bonding layer electrically connected to the metal layer of the third unit wafer;

forming a second unit connection hole, wherein the second unit connection hole penetrates through the substrate of the fourth wafer of the second unit and exposes the metal layer of the fourth wafer of the second unit;

forming a second unit connection layer, wherein the second unit connection layer fills the second unit connection hole, the second passivation layer in the fourth wafer of the second unit covers the second unit connection layer, the second lead-out hole penetrates through the second passivation layer and interconnects with the second unit connection hole, the second bonding layer fills the second lead-out hole and is electrically connected to the metal layer of the fourth wafer of the second unit through the second unit connection layer;

forming an additional second passivation layer in the first wafer of the second unit, the additional second passivation layer covering the second unit interconnection layer;

forming an additional second lead-out hole, wherein the additional second lead-out hole penetrates through the additional second passivation layer of the second unit;

forming an additional second bonding layer of the second unit, wherein the additional second bonding layer of the second unit fills the additional second lead-out hole and is electrically connected to the second unit interconnection layer; and bonding the third unit wafer to the first wafer of the second unit, wherein the third bonding layer of the third unit is in contact with the additional second bonding layer of the second unit so as to achieve an electrical connection.

19. The method according to claim 14, further comprising, during forming the first trench and the lead-out layer:

forming a first opening, wherein the first opening is located at the bottom of the first trench and interconnects with the first trench, the first opening located above the metal layer of the topmost wafer and exposing the metal layer of the topmost wafer, the lead-out layer electrically connected to the metal layer of the topmost wafer through the first opening.

20. The method according to claim 19, comprising, during forming the lead-out layer:

depositing a lead-out material layer, wherein the lead-out material layer fills the first opening and covers a surface of the first trench and a surface of the topmost wafer;

forming a photoresist, wherein the photoresist fills the first trench and covers a surface of the lead-out material layer;

exposing and developing to form a patterned photoresist, wherein the patterned photoresist covers the bottom of the first trench;

removing an uncovered lead-out material layer by dry etching with the patterned photoresist serving as a mask; and removing the patterned photoresist.

* * * * *